United States Patent
Wu et al.

(10) Patent No.: US 12,302,584 B2
(45) Date of Patent: May 13, 2025

(54) EMBEDDED FERROELECTRIC MEMORY IN HIGH-K FIRST TECHNOLOGY

(71) Applicant: Taiwan Semiconductor Manufacturing Company, Ltd., Hsin-Chu (TW)

(72) Inventors: Wei Cheng Wu, Zhubei (TW); Pai Chi Chou, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/358,216

(22) Filed: Jul. 25, 2023

(65) Prior Publication Data

US 2023/0371271 A1 Nov. 16, 2023

Related U.S. Application Data

(63) Continuation of application No. 17/230,191, filed on Apr. 14, 2021, now Pat. No. 11,751,400, which is a
(Continued)

(51) Int. Cl.
*H01L 27/1159* (2017.01)
*H01L 21/762* (2006.01)
(Continued)

(52) U.S. Cl.
CPC ....... *H10B 51/30* (2023.02); *H01L 21/76224* (2013.01); *H01L 29/0657* (2013.01);
(Continued)

(58) Field of Classification Search
CPC ........... H01L 27/1159; H01L 29/78391; H01L 29/516; H01L 29/6684; H01L 21/76224;
(Continued)

(56) References Cited

U.S. PATENT DOCUMENTS 9,859,290 B1 * 1/2018 Wang ................. H01L 29/4966
10,056,463 B2 8/2018 Xing et al.
(Continued)

FOREIGN PATENT DOCUMENTS

CN 101916782 A 12/2010
KR 20020010797 A 2/2002

OTHER PUBLICATIONS

Non-Final Office Action dated Sep. 30, 2020 for U.S. Appl. No. 16/428,229.
(Continued)

*Primary Examiner* — Karen Kusumakar
(74) *Attorney, Agent, or Firm* — Eschweiler & Potashnik, LLC

(57) ABSTRACT

In some embodiments, the present disclosure relates to an integrated chip structure. The integrated chip structure includes a first doped region and a second doped region disposed within a substrate. A ferroelectric material is arranged over the substrate and between the first doped region and the second doped region. An isolation structure is arranged within the substrate along a first side of the ferroelectric material. The isolation structure has a first width measured along an uppermost surface of the isolation structure and a second width measured along a horizontal line below the uppermost surface of the isolation structure. The second width is larger than the first width.

20 Claims, 17 Drawing Sheets

Related U.S. Application Data continuation of application No. 16/428,229, filed on May 31, 2019, now Pat. No. 11,004,867.

(60) Provisional application No. 62/691,072, filed on Jun. 28, 2018.

(51) Int. Cl.

| | | |
|---|---|---|
| *H01L 29/06* | (2006.01) | |
| *H01L 29/423* | (2006.01) | |
| *H01L 29/51* | (2006.01) | |
| *H01L 29/66* | (2006.01) | |
| *H01L 29/78* | (2006.01) | |
| *H10B 51/30* | (2023.01) | |

(52) U.S. Cl.
CPC ...... *H01L 29/42364* (2013.01); *H01L 29/516* (2013.01); *H01L 29/6684* (2013.01); *H01L 29/78391* (2014.09)

(58) Field of Classification Search
CPC ........... H01L 29/0657; H01L 29/42364; H01L 21/28132; H01L 21/28141; H01L 21/76229; H01L 27/11592; H01L 27/11595; H01L 29/40111; H01L 29/6656; H01L 29/66575; H01L 29/513; H01L 29/517; H01L 29/66545; H01L 27/11507; H01L 27/11512

See application file for complete search history.

(56) References Cited

U.S. PATENT DOCUMENTS

| | | |
|---|---|---|
| 2005/0006685 A1 | 1/2005 | Natsume et al. |
| 2011/0241091 A1 | 10/2011 | Dubourdieu et al. |
| 2013/0264620 A1 | 10/2013 | Yu et al. |
| 2016/0071947 A1* | 3/2016 | Wiatr ............... H01L 29/516 |
| | | 257/295 |
| 2016/0133717 A1 | 5/2016 | Ramaswamy et al. |
| 2017/0005166 A1 | 1/2017 | Park et al. |
| 2017/0133478 A1 | 5/2017 | Ramaswamy et al. |
| 2017/0148919 A1 | 5/2017 | Baars et al. |

OTHER PUBLICATIONS

Notice of Allowance dated Jan. 14, 2021 for U.S. Appl. No. 16/428,229.

Non-Final Office Action dated Dec. 19, 2022 for U.S. Appl. No. 17/230,191.

Final Office Action dated Mar. 22, 2023 for U.S. Appl. No. 17/230,191.

Notice of Allowance dated May 1, 2023 for U.S. Appl. No. 17/230,191.

\* cited by examiner

EMBEDDED FERROELECTRIC MEMORY IN HIGH-K FIRST TECHNOLOGY

This application is a Continuation of U.S. application Ser. No. 17/230,191, filed on Apr. 14, 2021, which is a Continuation of U.S. application Ser. No. 16/428,229, filed on May 31, 2019 (now U.S. Pat. No. 11,004,867, issued on May 11, 2021), which claims the benefit of U.S. Provisional Application No. 62/691,072, filed on Jun. 28, 2018. The contents of the above-referenced Patent Applications are hereby incorporated by reference in their entirety.

BACKGROUND

Many modern day electronic devices contain electronic memory configured to store data. Electronic memory may be volatile memory or non-volatile memory. Volatile memory stores data while it is powered, while non-volatile memory is able to store data when power is removed. Ferroelectric random-access memory (FeRAM) devices are one promising candidate for a next generation non-volatile memory technology. This is because FeRAM devices provide for many advantages, including a fast write time, high endurance, low power consumption, and low susceptibility to damage from radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
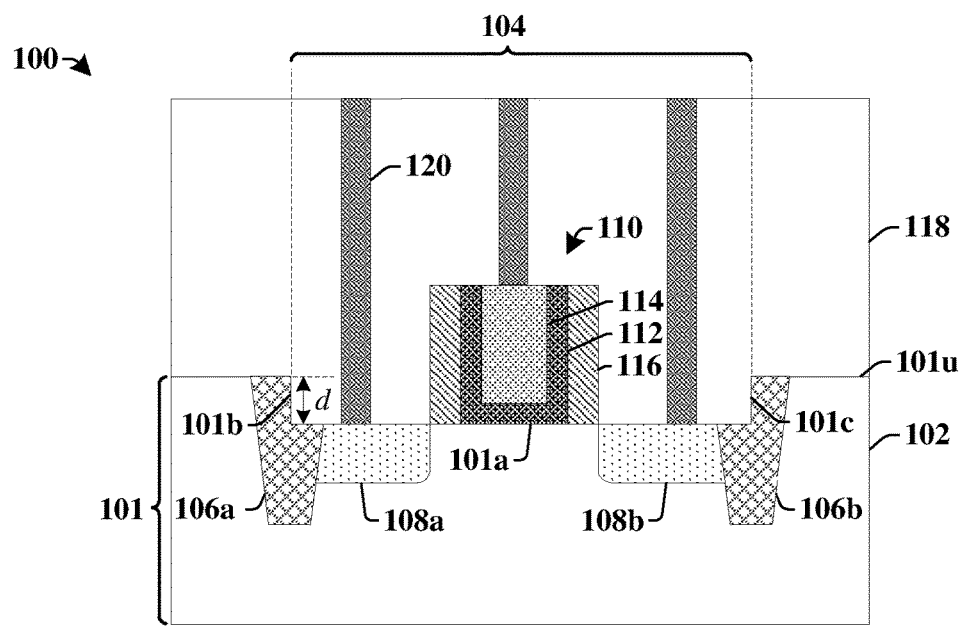
FIG. 1 illustrates a cross-sectional view of some embodiments of an integrated chip having a ferroelectric random-access memory (FeRAM) device with a nested electrode.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embedded memory has become common in modern day integrated chips. Embedded memory is electronic memory devices that are located on a same integrated chip die as logic devices (e.g., a processor or ASIC). By embedding memory devices and logic devices on a same integrated chip die, the conductive interconnects between the memory devices and the logic devices can be shortened, thereby reducing power and increasing performance of an integrated chip.

Many modern day integrated chips use flash memory in embedded memory systems due to its non-volatile nature (i.e., its ability to retain a stored data state without power), its high density, its fast write speeds, and its compatibility with modern CMOS fabrication processes. However, embedded flash memory is formed by a relatively complex process that can use a large number of masks (e.g., greater than 15 or 20 masks). The complexity of the process causes the formation of embedded flash memory to be costly.

The present disclosure, in some embodiments, relates to an integrated chip having an embedded FeRAM device that is formed using a relatively simple fabrication process. The relatively simple fabrication process is performed by replacing a sacrificial memory structure with an FeRAM device prior to the formation of a high-k metal gate logic device. The process results in the FeRAM device having a nested structure, which includes a ferroelectric layer having sidewalls defining a recess within an upper surface of the ferroelectric layer and a conductive electrode nested within the recess. Forming the FeRAM device using the replacement process allows for the FeRAM device to be formed in an efficient manner (e.g., embedded FeRAM can be formed using between 10%-30% of the photomasks used in an embedded flash fabrication process) that allows for low-cost fabrication of the embedded FeRAM device.

FIG. 1 illustrates a cross-sectional view of some embodiments of an integrated chip 100 having a ferroelectric random-access memory (FeRAM) device with a nested electrode.

The integrated chip 100 comprises a substrate 101 having one or more isolation structures 106a-106b disposed within trenches in a semiconductor substrate 102. In some embodiments, the substrate 101 may have a recessed surface 101a extending between a first sidewall 101b and a second sidewall 101c to define a depressed region 104 that is recessed below an upper surface 101u of the substrate 101 by a non-zero distance d. In some embodiments (not shown), the first sidewall 101b and the second sidewall 101c may comprise tapered (i.e., angled) sidewalls that cause a width of the depressed region 104 to decrease as a depth of the depressed region 104 increases.

In some embodiments, the one or more isolation structures 106a-106b may be arranged along edges of the depressed region 104 of the semiconductor substrate 102. In some such embodiments, the first isolation structure 106a and the second isolation structure 106b may comprise a same isolation structure continuously extending in a closed loop around a perimeter of the depressed region 104. In some embodiments, the one or more isolation structures 106a-106b may comprise shallow trench isolation structures having one or more dielectric materials disposed within the trenches in the semiconductor substrate 102.

An FeRAM device 110 is arranged over the substrate 101 between a first doped region 108a and a second doped region 108b within the recessed surface 101a. The FeRAM device 110 comprises a ferroelectric material 112 having sidewalls defining a recess within an upper surface of the ferroelectric material 112. A conductive electrode 114 is nested within the recess. In some embodiments, the conductive electrode 114 may directly contact an upper surface and sidewalls of the ferroelectric material 112. In some embodiments, the ferroelectric material 112 and the conductive electrode 114 have uppermost surfaces that are substantially co-planar (e.g., co-planar within a tolerance of a chemical mechanical planarization process).

Nesting the conductive electrode 114 of the FeRAM device 110 within the ferroelectric material 112 allows for the FeRAM device 110 to be formed by way of an efficient fabrication process that uses a relatively small number of photomasks (e.g., between 2 and 5 photomasks). Moreover, although the FeRAM device 110 may have a greater height than logic devices (e.g., MOSFETs) on the integrated chip 100, positioning the FeRAM device 110 within the depressed region 104 allows for the FeRAM device 110 to be formed without impacting the logic devices.

An inter-level dielectric (ILD) structure 118 is arranged over the substrate 101 and laterally surrounds the FeRAM device 110. Conductive contacts 120 extend through the ILD structure 118 to contact the first doped region 108a, the second doped region 108b, and the conductive electrode 114.

During operation, bias voltages may be applied to one or more of the first doped region 108a, the second doped region 108b, and/or the conductive electrode 114. For example, in some embodiments, bias voltages may be applied to the first doped region 108a, the second doped region 108b, and the conductive electrode 114, while in other embodiments, bias voltages may be applied to the first doped region 108a and the conductive electrode 114 and not to the second doped region 108b. The bias voltages allow for data states to be written to and/or read from the FeRAM device 110. For example, during a write operation, one or more bias voltages can be applied to cause charge carriers (e.g., electrons and/or holes) to accumulate between the first doped region 108a and the second doped region 108b. The charge carriers generate electric fields, which extend through the ferroelectric material 112. The electric fields are configured to change positions of electric dipoles within the ferroelectric material 112 depending on the bias voltages. If the magnetic polarization of the ferroelectric material 112 has a first polarization on a specific bias voltage, the FeRAM device 110 will digitally store data as a first bit value (e.g., a logical "0"). Alternatively, if the magnetic polarization of the ferroelectric material 112 has a second polarization on a different bias voltage from the former, the FeRAM device 110 will digitally store data as a second bit value (e.g., a logical "1").

Figure 2:
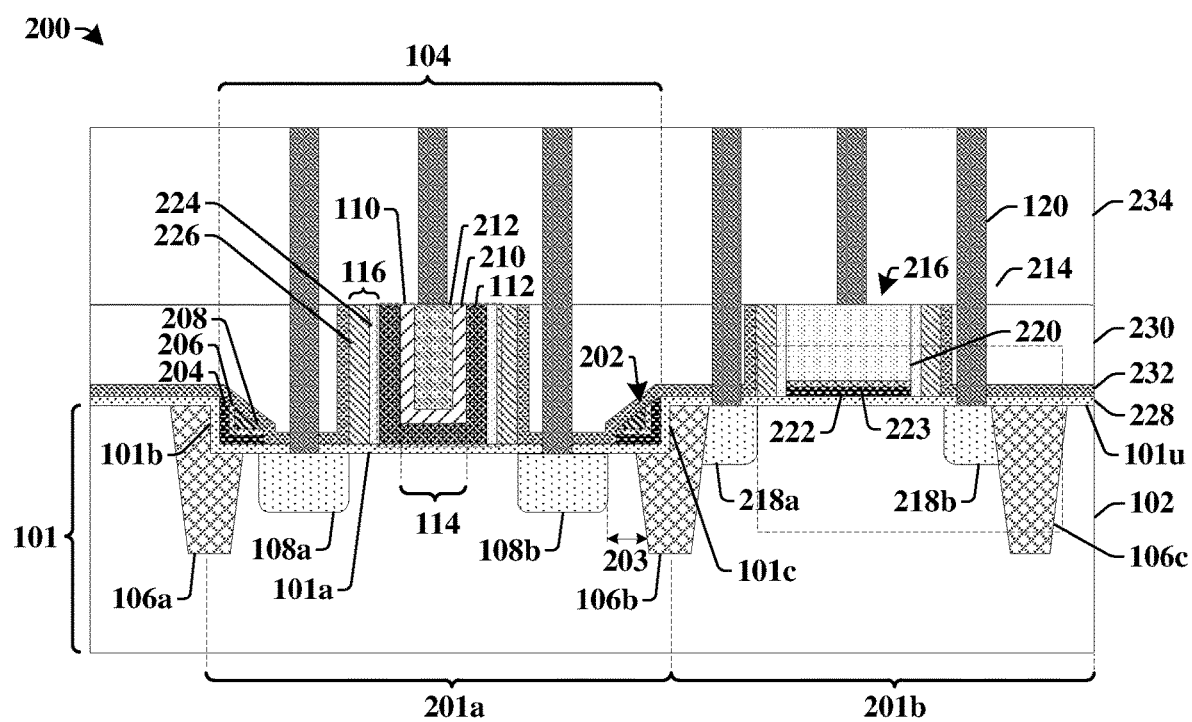
FIG. 2 illustrates a cross-sectional view of some additional embodiments of an integrated chip having an embedded FeRAM device with a nested electrode.

FIG. 2 illustrates a cross-sectional view of some additional embodiments of an integrated chip 200 having an embedded FeRAM device with a nested electrode.

The integrated chip 200 comprises a substrate 101 having one or more isolation structures 106a-106c disposed within trenches in a semiconductor substrate 102. The one or more isolation structures 106a-106c separate an embedded memory region 201a from a logic region 201b. Within the embedded memory region 201a, the substrate 101 may have a recessed surface 101a that extends between a first sidewall 101b and a second sidewall 101c to define a depressed region 104 that is recessed below an upper surface 101u of the substrate 101. In some embodiments, the one or more isolation structures 106a-106c may comprise shallow trench isolation (STI) structure having substantially flat bottom surfaces (i.e., bottom surfaces substantially parallel to the upper surface 101u) extending between opposing sidewalls.

In some embodiments, isolation structures 106a-106c may define the first sidewall 101b of the substrate 101 and the second sidewall 101c of the substrate 101. Isolation structures 106a-106b may further define a horizontally extending surface 101a coupled to the first sidewall 101b or the second sidewall 101c. A replacement gate remnant 202 may be disposed over the horizontally extending surface 101a. In some embodiments, the replacement gate remnant 202 may comprise a dielectric film 204, a metal cap layer 206, and a sacrificial layer 208. In some embodiments, dielectric film 204 comprises a high-k dielectric, such as hafnium oxide, hafnium silicon oxide, hafnium tantalum oxide, aluminum oxide, zirconium oxide, or the like. In some embodiments, the metal cap layer 206 may comprise titanium nitride, tantalum nitride, or the like. In some embodiments, the sacrificial layer 208 may comprise polysilicon, or the like.

In some embodiments, the replacement gate remnant 202 comprises a tapered sidewall facing the depressed region 104. For example, in some embodiments, the dielectric film 204 and the metal cap layer 206 may respectively comprise a horizontally extending segment and a vertically extending segment protruding outward from an upper surface of the horizontally extending segment, while the sacrificial layer 208 has a tapered sidewall extending between the horizontally extending segment and the vertically extending segment of the metal cap layer 206.

In some embodiments, the replacement gate remnant 202 extends from directly over the horizontally extending surface of isolation structures 106a-106b of the substrate 101 to directly over a horizontally extending surface of the semiconductor substrate 102. In some such embodiments, the replacement gate remnant 202 is arranged over a region 203 of the semiconductor substrate 102 that is between a first doped region 108a and a first isolation structure 106a and/or that is between a second doped region 108b and a second isolation structure 106b.

An FeRAM device 110 is arranged over the recessed surface 101a of the substrate 101 defining the depressed region 104. The FeRAM device 110 comprises a ferroelectric material 112 arranged between the first doped region 108a and the second doped region 108b. The ferroelectric material 112 has sidewalls that define a recess within an uppermost surface of the ferroelectric material 112. A conductive electrode 114 is disposed within the recess.

In some embodiments, the conductive electrode 114 comprises a metallic material 210 and a conductive material 212. The conductive material 212 is vertically and laterally separated from the ferroelectric material 112 by the metallic material 210. In some embodiments, the ferroelectric material 112 has sidewalls defining a first recess within an upper surface of the ferroelectric material 112, the metallic material 210 is nested within the first recess and has sidewalls defining a second recess within an upper surface of the metallic material 210, and the conductive material 212 nested within the second recess. In some embodiments, the ferroelectric material 112 has a greater height than both the metallic material 210 and the conductive material 212. In some such embodiments, the ferroelectric material 112, the metallic material 210, and the conductive material 212 may have uppermost surfaces that are substantially co-planar.

In various embodiments the ferroelectric material 112 may comprise, lead titanate, lead zirconate titanate (PZT), lead lanthanum zirconate titanate, strontium bismuth tantalate (SBT), bismuth lanthanum titanate (BLT) and bismuth neodymium titanate (BNT), or the like. In some embodiments, the metallic material 210 may comprise one or more metals such as aluminum, ruthenium, palladium, hafnium, zirconium, titanium, or the like. In some embodiments, the conductive material 212 may comprise aluminum, copper, or the like.

A transistor device 214 is arranged within the logic region 201b. The transistor device 214 comprises a gate structure 216 arranged over the upper surface 101u of the semiconductor substrate 102 between a source region 218a and a drain region 218b. The gate structure 216 comprises a gate electrode 220 separated from the semiconductor substrate 102 by a gate dielectric 222 and a metal cap layer 223. In some embodiments, the gate electrode 220 may comprise a metal gate electrode (e.g., comprising aluminum, ruthenium, palladium, or the like) and the gate dielectric 222 may comprise a high-k dielectric (e.g., comprising aluminum oxide, hafnium oxide, or the like). In other embodiments, the gate electrode 220 may comprise a polysilicon gate electrode and the gate dielectric 222 may comprise an oxide (e.g., silicon dioxide). In some embodiments, the metal cap layer 223 may comprise titanium nitride, tantalum nitride, or the like.

Sidewall spacers 116 are arranged along opposing sides of the FeRAM device 110 and the transistor device 214. In some embodiments, the sidewall spacers 116 may comprise a first dielectric material 224 and a second dielectric material 226. In some embodiments, the first dielectric material 224 may comprise a different dielectric material (e.g., silicon nitride) than the second dielectric material 226 (e.g., silicon oxide). In some embodiments, the FeRAM device 110 and the transistor device 214 may be separated from the semiconductor substrate 102 by way of a first dielectric layer 228 that extends over the semiconductor substrate 102 and over the one or more isolation structures 106. In some embodiments, the first dielectric layer 228 may comprise an oxide (e.g., silicon oxide) or another dielectric material.

A first inter-level dielectric (ILD) layer 230 is laterally separated from the FeRAM device 110 and the gate electrode 220 by way of the one or more sidewall spacers 116. The ferroelectric material 112, the metallic material 210, and the conductive material 212, and the gate electrode 220 extend to the upper surface of the first ILD layer 230. In some embodiments, an etch stop layer (ESL) 232 may be arranged between the sidewall spacers 116 and the first ILD layer 230. In some embodiments, the ESL 232 may have an upper surface that is substantially co-planar with upper surfaces of the ferroelectric material 112, the metallic material 210, and the conductive material 212. A second ILD layer 234 is over the first ILD layer 230. The second ILD layer 234 surrounds conductive contacts 120 that extend to the FeRAM device 110 and the transistor device 214. In some embodiments, the first ILD layer 230 and/or the second ILD layer 234 may comprise borophosphosilicate glass (BPSG), borosilicate glass (BSG), phosphosilicate glass (PSG), or the like. In some embodiments, the conductive contacts 120 may comprise a metal such as tungsten, copper or the like.

Figure 3:
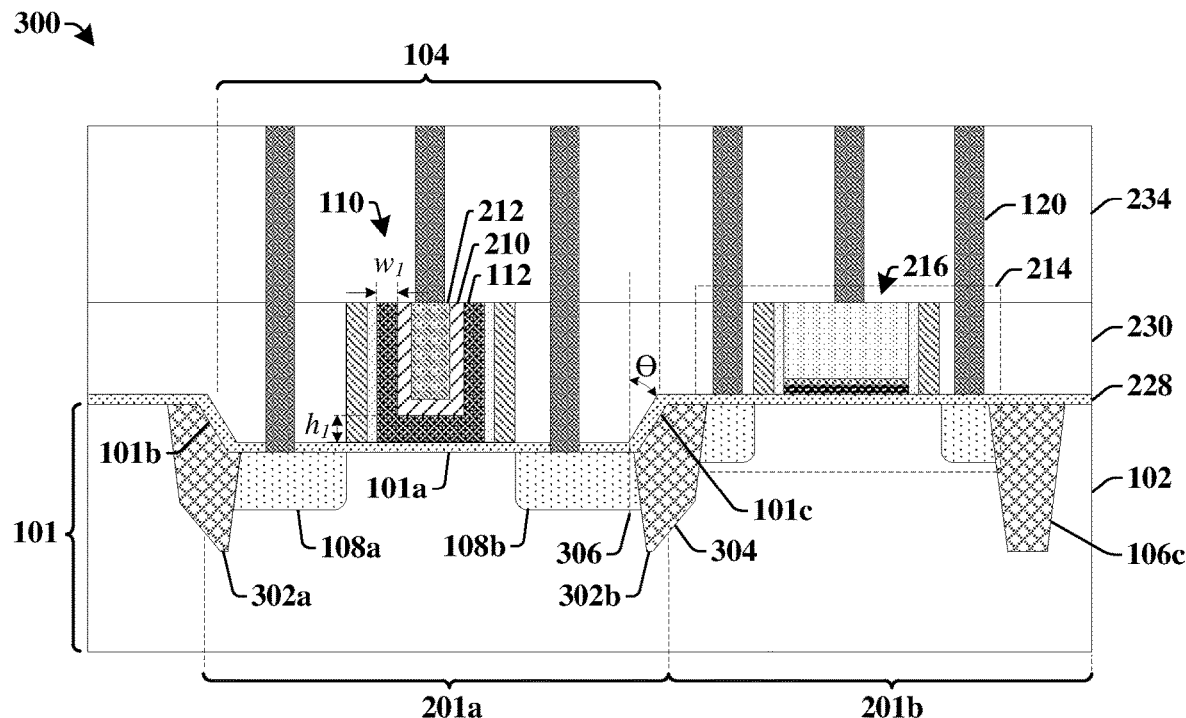
FIG. 3 illustrates a cross-sectional view of some alternative embodiments of an integrated chip having an embedded FeRAM device with a nested electrode.

FIG. 3 illustrates a cross-sectional view of some alternative embodiments of an integrated chip 300 having an embedded FeRAM device with a nested electrode.

The integrated chip 300 comprises a substrate 101 having an embedded memory region 201a and a logic region 201b. Within the embedded memory region 201a, an FeRAM device 110 is arranged over a recessed surface 101a of the substrate 101 extending between a first sidewall 101b and a second sidewall 101c. The FeRAM device 110 comprises a ferroelectric material 112, a metallic material 210, and a conductive material 212. The ferroelectric material 112 has a horizontally extending segment extending between first and second vertical protrusions that protrude outward from an upper surface of the horizontally extending segment. In some embodiments, the horizontally extending segment has height $h_1$ that is larger than a width $w_1$ of the first vertical protrusion and/or the second vertical protrusion.

One or more isolation structures 302a-302b are arranged within a semiconductor substrate 102 and define the first sidewall 101b of the substrate 101 and the second sidewall 101c of the substrate 101. In some embodiments, the first sidewall 101b and the second sidewall 101c are oriented at an acute angle θ with respect to a line 306 that is normal to the recessed surface 101a of the substrate 101. In some embodiments, the acute angle θ may be in a range of between approximately 10° and approximately 80°. In other embodiments, the acute angle θ may be in a range of between approximately 30° and approximately 60°. In some embodiments, the angled orientation of the first sidewall 101b and the second sidewall 101c may cause a width of isolation structures 302a-302b to respectively decrease as a height over the recessed surface 101a increases. In some embodiments, the one or more isolation structures 302a-302b may have angled lower sidewalls 304.

FIGS. 4-16 illustrate cross-sectional views 400-1600 of some embodiments of a method of forming an integrated chip having an embedded FeRAM device with a nested electrode. The method forms the FeRAM device using a replacement process that is performed prior to formation of a high-k metal gate device. The method allows for the FeRAM device to be formed using minimal photomasks (e.g., between 2 and 5 photomasks). Although FIGS. 4-16 are described in relation to a method, it will be appreciated that the structures disclosed in FIGS. 4-16 are not limited to such a method, but instead may stand alone as structures independent of the method.

Figure 4:
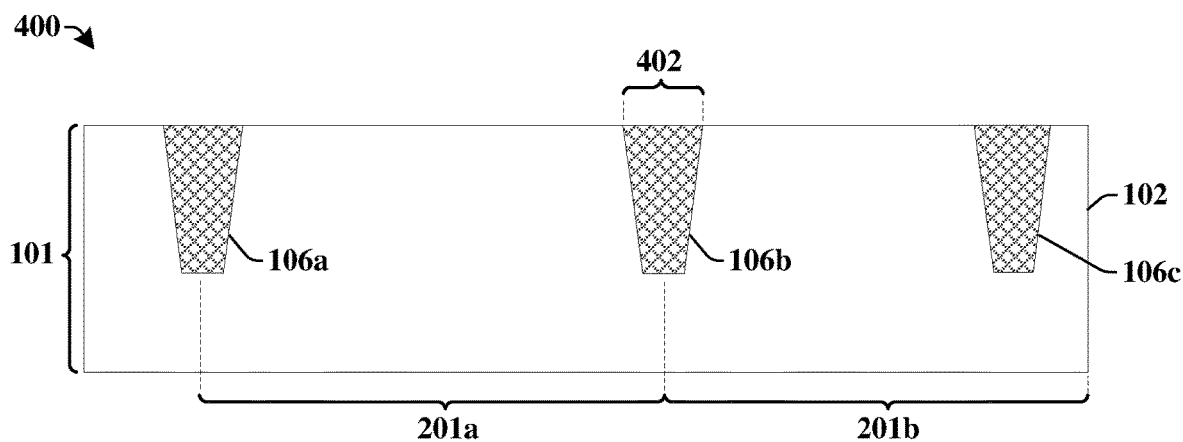
FIGS. 4-16 illustrate cross-sectional views of some embodiments of a method of forming an integrated chip having an embedded FeRAM device with a nested electrode.

As shown in cross-sectional view 400 of FIG. 4, a substrate 101 is provided. In various embodiments, the semiconductor substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith.

One or more isolation structures 106a-106c are formed within one or more trenches 402 in the semiconductor substrate 102. In some embodiments, the one or more isolation structures 106a-106c are formed by selectively exposing the semiconductor substrate 102 to a first etchant according to a first masking layer to form trenches 402, which are subsequently filled with one or more dielectric materials. In various embodiments, the first masking layer may comprise photoresist, silicon nitride, silicon carbide, titanium nitride, or the like. The one or more isolation structures 106a-106c are laterally arranged between an embedded memory region 201a and a logic region 201b. In various embodiments, the first etchant may comprise a dry etchant having an etching chemistry comprising a fluorine species (e.g., $CF_4$, $CHF_3$, $C_4F_8$, etc.) or a wet etchant comprising hydrofluoric acid (HF), potassium hydroxide (KOH), or the like As shown in cross-sectional view 500 of FIG. 5, the embedded memory region 201a is recessed below an upper surface 102u of the semiconductor substrate 102. Recessing the embedded memory region 201a forms a depressed region 104 within the substrate 101 that is recessed below the upper surface 102u of the semiconductor substrate 102 by a non-zero distance d. In some embodiments, the non-zero distance d may be greater than approximately 10 nm. The depressed region 104 is defined by sidewalls, 101b and 101c, and a recessed surface 101a of the substrate 101. In some embodiments, the embedded memory region 201a may be recessed by selectively exposing the substrate 101 to a second etchant according to a second masking layer 502 formed over the substrate 101. In various embodiments, the second etchant may comprise a dry etchant having an etching chemistry comprising a fluorine species (e.g., $CF_4$, $CHF_3$, $C_4F_8$, etc.) or a wet etchant comprising hydrofluoric acid (HF), potassium hydroxide (KOH), or the like. In some embodiments, the second masking layer 502 may comprise photoresist, silicon nitride, silicon carbide, titanium nitride, tantalum nitride, or the like.

Figure 6:
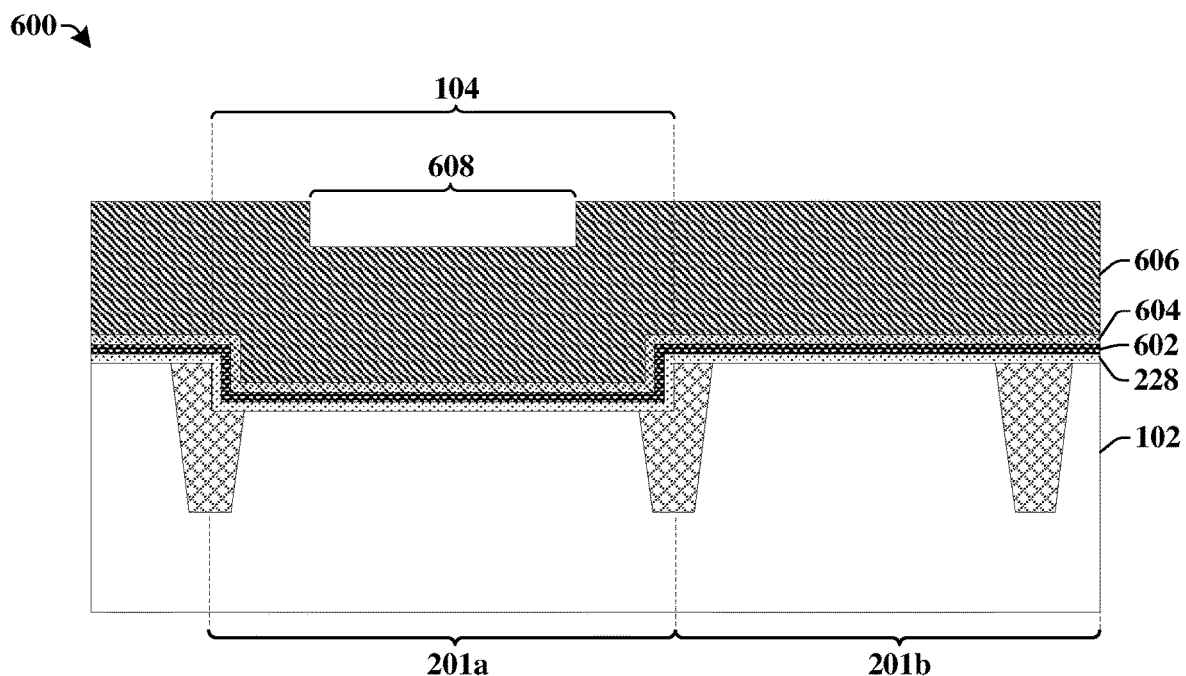

As shown in cross-sectional view 600 of FIG. 6, a first dielectric layer 228 is formed over the substrate 101. The first dielectric layer 228 is arranged along horizontally extending surfaces and vertically extending surfaces of the substrate 101. A dielectric film 602 is formed over the first dielectric layer 228, a metal cap layer 604 is formed over the dielectric film 602, and a sacrificial layer 606 is formed over the metal cap layer 604. In some embodiments, the first dielectric layer 228 may comprise an oxide (e.g., silicon oxide or the like) formed by a thermal process. In some embodiments, the dielectric film 602 may comprise a high-k dielectric material, such as aluminum oxide, hafnium oxide, or the like, formed by a deposition process (e.g., ALD, CVD, PE-CVD, PVD, etc.). In some embodiments, the metal cap layer 604 may comprise titanium nitride, tantalum nitride, or the like, formed by a deposition process. In some embodiments, the sacrificial layer 606 may comprise polysilicon formed by a deposition process. In some embodiments, the sacrificial layer 606 may have sidewalls that define a depression 608 over the depressed region 104.

Figure 7:
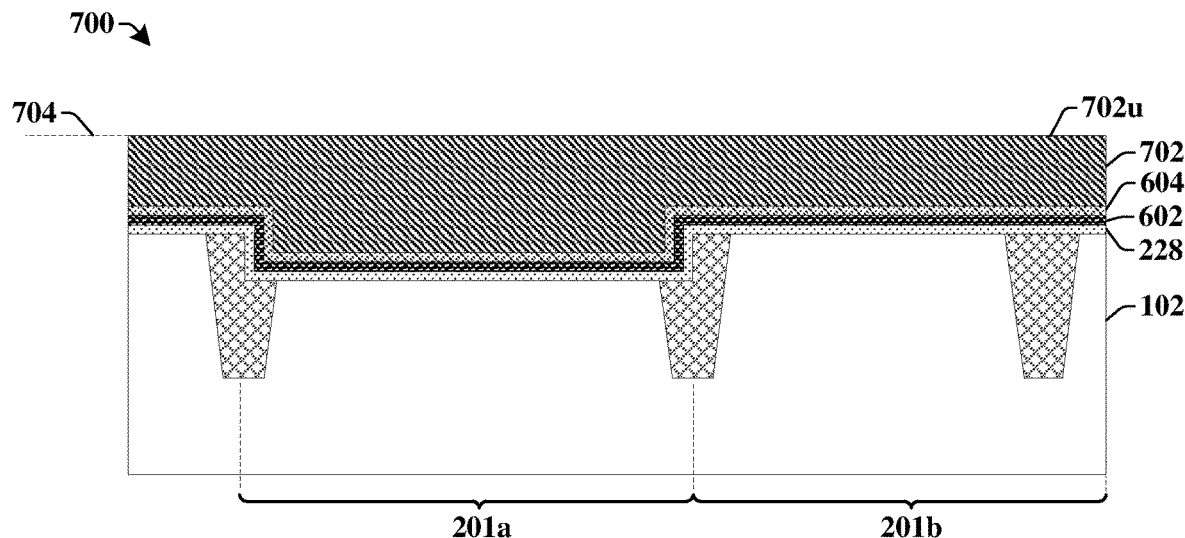

As shown in cross-sectional view 700 of FIG. 7, a first planarization process is performed on the sacrificial layer 702 along line 704. The first planarization process removes part of the sacrificial layer (606 of FIG. 6) to give the sacrificial layer 702 a planar upper surface 702u that continuously extends over the embedded memory region 201a and over the logic region 201b. In some embodiments, the first planarization process may comprise a chemical mechanical planarization (CMP) process. In some embodiments, the first planarization process may be performed prior to patterning the sacrificial layer (shown in FIG. 8). In other embodiments (not shown), the first planarization process may be performed after patterning the sacrificial layer (shown in FIG. 8).

Figure 8:
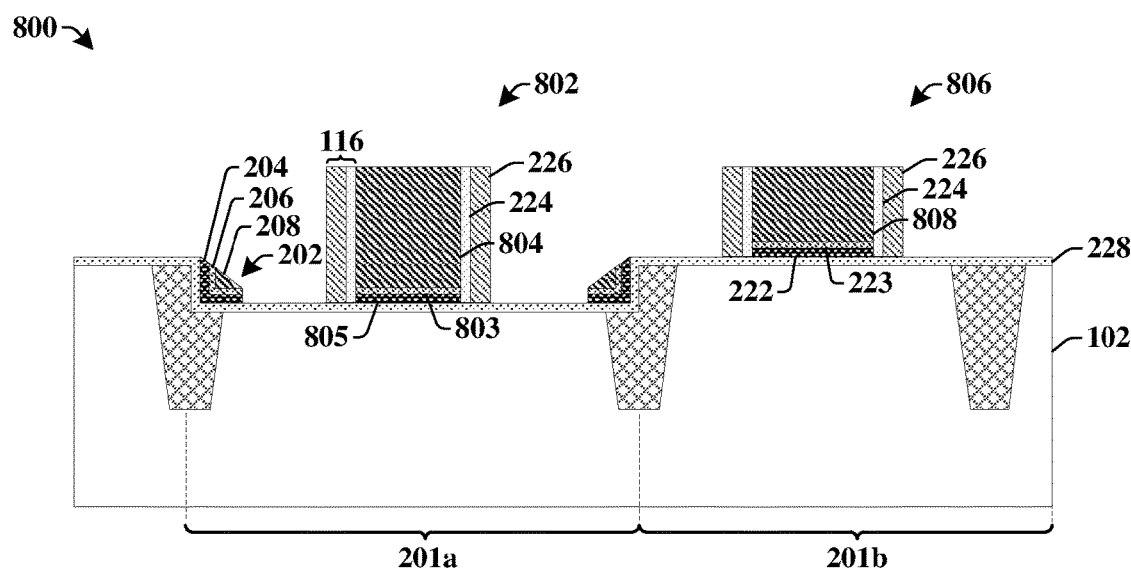

As shown in cross-sectional view 800 of FIG. 8, the sacrificial layer (702 of FIG. 7), the dielectric film (602 of FIG. 7), and the metal cap layer (604 of FIG. 7) are patterned to define a sacrificial memory structure 802 within the embedded memory region 201a and a sacrificial gate structure 806 within the logic region 201b. The sacrificial memory structure 802 comprises a sacrificial memory element 804 over a sacrificial dielectric layer 805 and a sacrificial metal cap 803. The sacrificial gate structure 806 comprises a sacrificial gate electrode 808 over a gate dielectric 222 (e.g., a high-k dielectric) and a metal cap layer 223. In some embodiments, the sacrificial layer (702 of FIG. 7) may be patterned by selectively exposing the sacrificial layer to a third etchant according to a third masking layer (e.g., a photoresist layer) formed over the sacrificial layer (702 of FIG. 7).

In some embodiments, patterning of the sacrificial layer (702 of FIG. 7) may leave a replacement gate remnant 202 along sidewalls of the depressed region 104. The replacement gate remnant 202 may comprise a part of the dielectric film 204 (a remnant of 602 of FIG. 7), the metal cap layer 206 (a remnant of 604 of FIG. 7), and the sacrificial layer 208 (a remnant of 702 of FIG. 7) remaining after the patterning of the sacrificial memory structure 802 and the sacrificial gate structure 806. In some embodiments, the replacement gate remnant 202 may have tapered sidewalls facing the sacrificial memory structure 802.

In some embodiments, sidewall spacers 116 may be formed along sidewalls of the sacrificial memory structure 802 and the sacrificial gate structure 806. In some embodiments, the sidewall spacers 116 may be formed by depositing one or more dielectric materials over the substrate 101 and subsequently etching the one or more dielectric materials to remove the one or more dielectric materials from horizontal surfaces. In some embodiments, the one or more dielectric materials may comprise a first dielectric material 224 and a second dielectric material 226 that is different than the first dielectric material 224. In some embodiments, the first dielectric material 224 and the second dielectric material 226 may respectively comprise an oxide, a nitride, a carbide, or the like.

Figure 9:
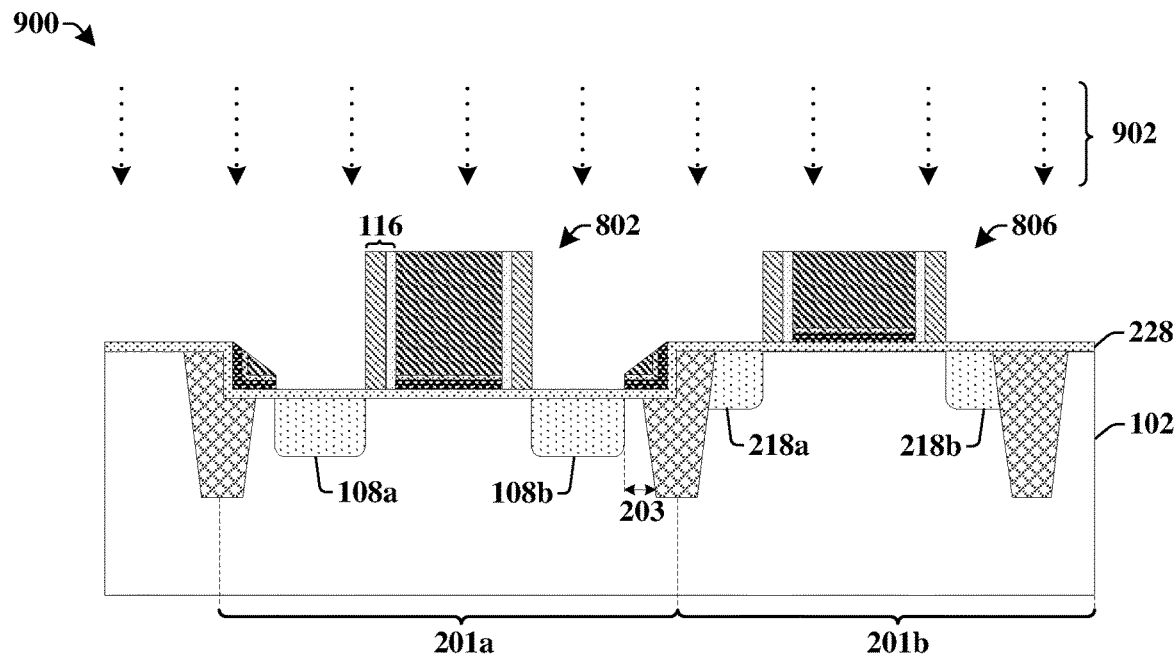

As shown in cross-sectional view 900 of FIG. 9, a first doped region 108a and a second doped region 108b are formed within the memory region 201a of the semiconductor substrate 102. A source region 218a and drain region 218b are also formed within the logic region 201b of the semiconductor substrate 102. In some embodiments, the first doped region 108a, the second doped region 108b, the source region 218a, and the drain region 218b may be formed by selectively implanting dopant species 902 into the semiconductor substrate 102 using one or more implantation processes. For example, in various embodiments, the first doped region 108a and the second doped region 108b may be formed by a same implantation process or different implantations processes as the source region 218a and the drain region 218b. In other embodiments, the first doped region 108a, the second doped region 108b, the source region 218a, and the drain region 218b may be formed by etching the semiconductor substrate 102 to define cavities and subsequently forming a doped epitaxial material within the cavities. In some embodiments, the replacement gate remnant 202 may act to mask the dopant species 902 from the semiconductor substrate 102, so that the first doped region 108a and the second doped region 108b are separated from the isolation structures 106a-106b by a region 203 of the substrate 101 having a non-zero distance.

Figure 10:
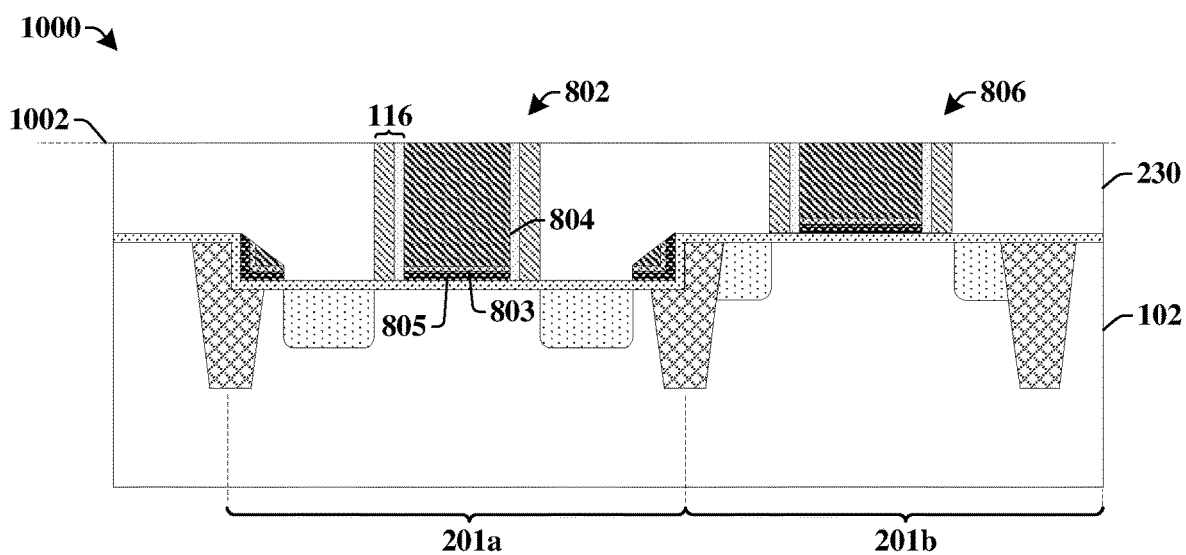

As shown in cross-sectional view 1000 of FIG. 10, a first inter-level dielectric (ILD) layer 230 is formed over the substrate 101. The first ILD layer 230 laterally surrounds the sacrificial memory structure 802 and the sacrificial gate structure 806. In various embodiments, the first ILD layer 230 may comprise an oxide deposited onto the substrate 101 by a chemical vapor deposition (CVD) deposition using high aspect ratio process (i.e., a HARP oxide). For example, in some embodiments, the first ILD layer 230 may comprise boron-phosphor-silicate glass deposited by a CVD process. After formation of the first ILD layer 230, a second planarization process may be performed along line 1002 to expose upper surfaces of the sacrificial memory structure 802 and the sacrificial gate structure 806.

Figure 11:
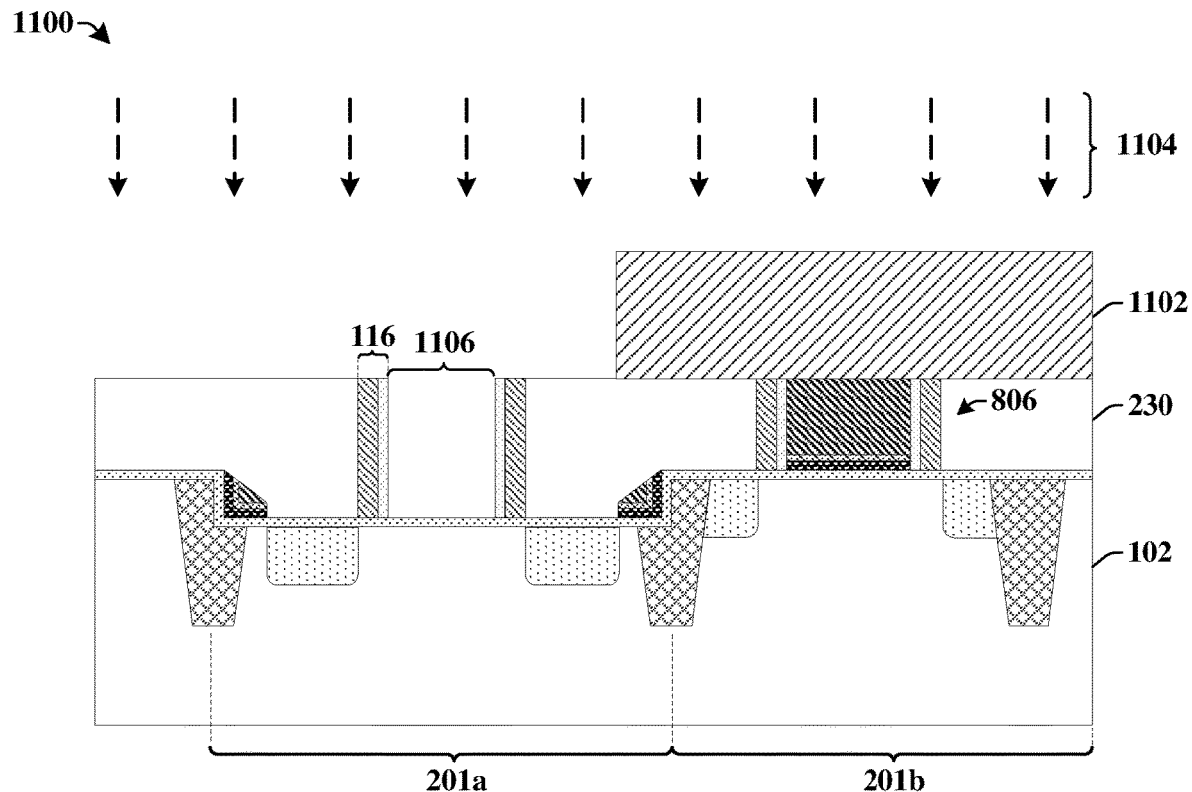

As shown in cross-sectional view 1100 of FIG. 11, the sacrificial memory element (804 of FIG. 10), the sacrificial dielectric layer (805 of FIG. 10), and the sacrificial metal cap (803 of FIG. 10) are removed from the sacrificial memory structure (802 of FIG. 10) to define a memory device cavity 1106 disposed between sidewalls of the sidewall spacers 116. In some embodiments, the sacrificial memory element (804 of FIG. 10) the sacrificial dielectric layer (805 of FIG. 10), and the sacrificial metal cap (803 of FIG. 10) may be removed by selectively exposing the sacrificial memory element, the sacrificial dielectric layer, and the sacrificial metal cap to a fourth etchant 1104. In some embodiments, prior to removing the sacrificial memory element (804 of FIG. 10), the sacrificial dielectric layer (805 of FIG. 10), and the sacrificial metal cap (803 of FIG. 10), a fourth masking layer 1102 may be formed over the logic region 201b to prevent the sacrificial gate electrode 808 from being removed by the fourth etchant 1104.

Figure 12:
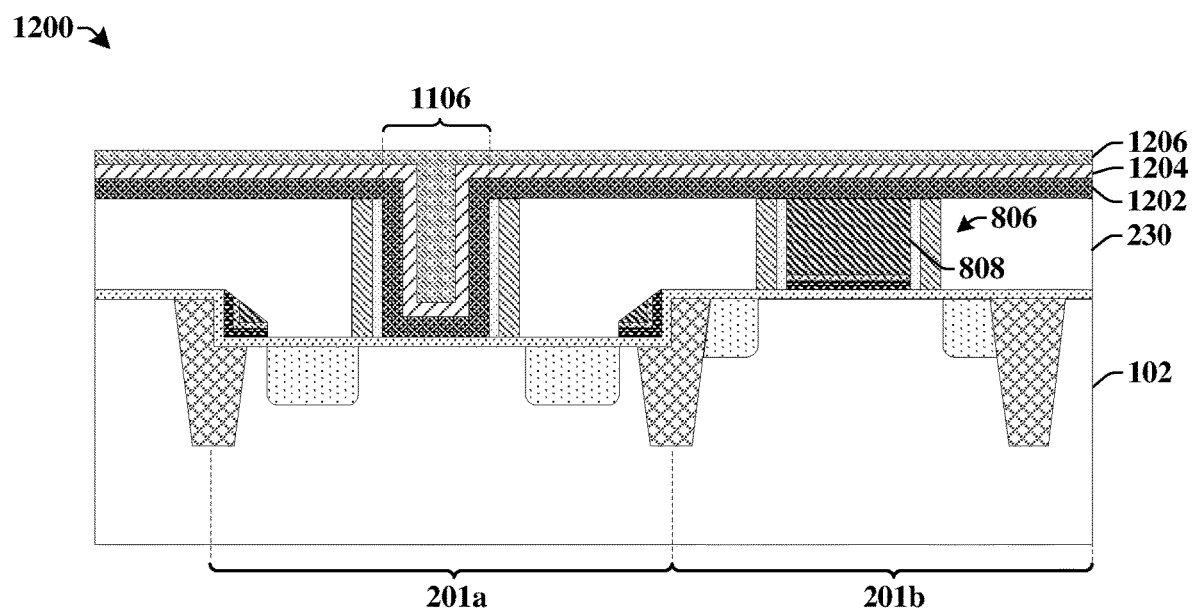

As shown in cross-sectional view 1200 of FIG. 12, a ferroelectric layer 1202 is formed over the substrate 101, a metallic layer 1204 is formed over the ferroelectric layer 1202, and a conductive layer 1206 is formed over the metallic layer 1204. The ferroelectric layer 1202 lines interior surfaces of the memory device cavity 1106. The ferroelectric layer 1202 also extends from within the memory device cavity 1106 to over upper surfaces of the first ILD layer 230 and the sacrificial gate structure 806. The metallic layer 1204 and the conductive layer 1206 also extend from within the memory device cavity 1106 to over upper surfaces of the first ILD layer 230 and the sacrificial gate structure 806. In some embodiments, the ferroelectric layer 1202, the metallic layer 1204, and the conductive layer 1206 may be formed by way of deposition processes.

Figure 13:
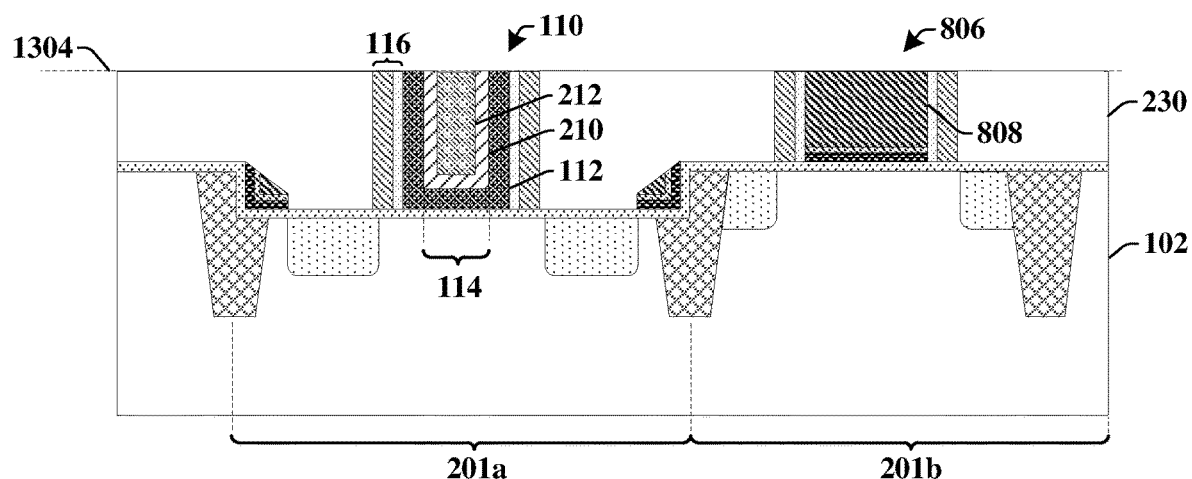

As shown in cross-sectional view 1300 of FIG. 13, a third planarization process is performed along line 1304 to define an FeRAM device 110 having a nested electrode. The third planarization process removes a part of the ferroelectric layer (1202 of FIG. 12) to define a ferroelectric material 112 confined within the memory device cavity 1106. The second planarization process also removes parts of the metallic layer (1204 of FIG. 12) and the conductive layer 1206 to define a conductive electrode 114 comprising a metallic material 210 (e.g., gate metal) and a conductive material 212 confined within the memory device cavity 1106. In some embodiments, the third planarization process may comprise a CMP process.

Figure 14:
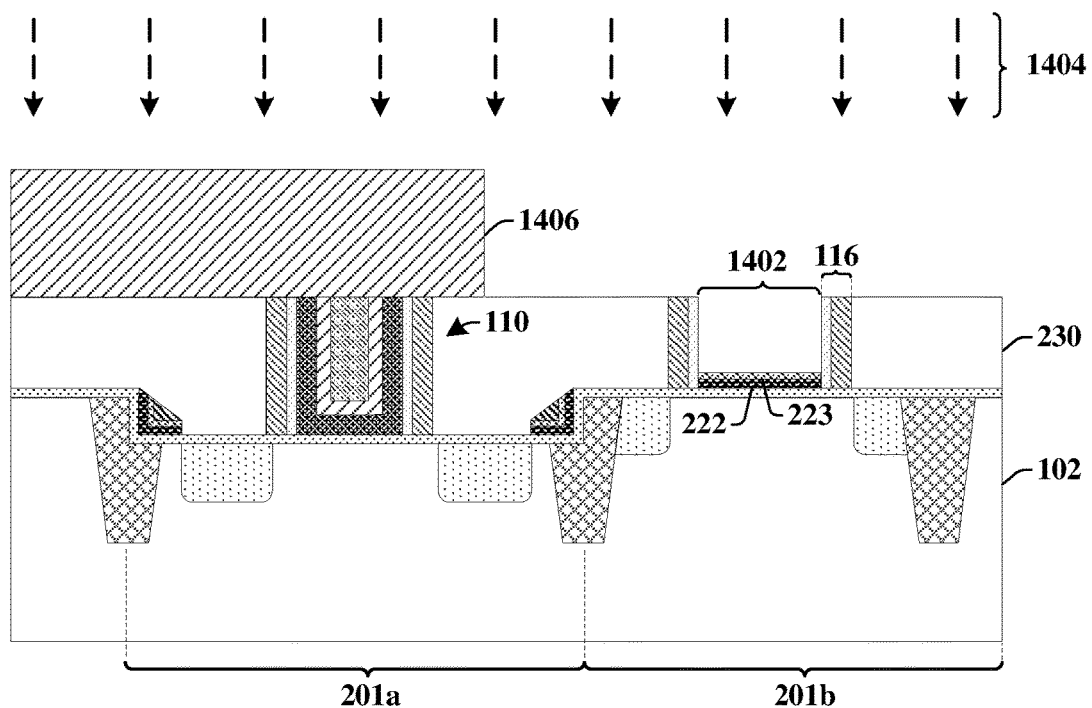

As shown in cross-sectional view 1400 of FIG. 14, the sacrificial gate electrode (808 of FIG. 13) is removed from the sacrificial gate structure (806 of FIG. 13) to define a gate electrode cavity 1402. In some embodiments, the sacrificial gate electrode (808 of FIG. 13) may be removed by selectively exposing the sacrificial gate electrode (808 of FIG. 13) to a fifth etchant 1404. In some embodiments, prior to removing the sacrificial gate electrode, a fifth masking layer 1406 may be formed over the memory region 201a to prevent the fifth etchant 1404 from damaging the FeRAM device 110. In some embodiments, removal of the sacrificial gate electrode (808 of FIG. 13) may leave the gate dielectric 222 and the metal cap layer 223 over the semiconductor substrate 102 within the gate electrode cavity 1402.

Figure 15:
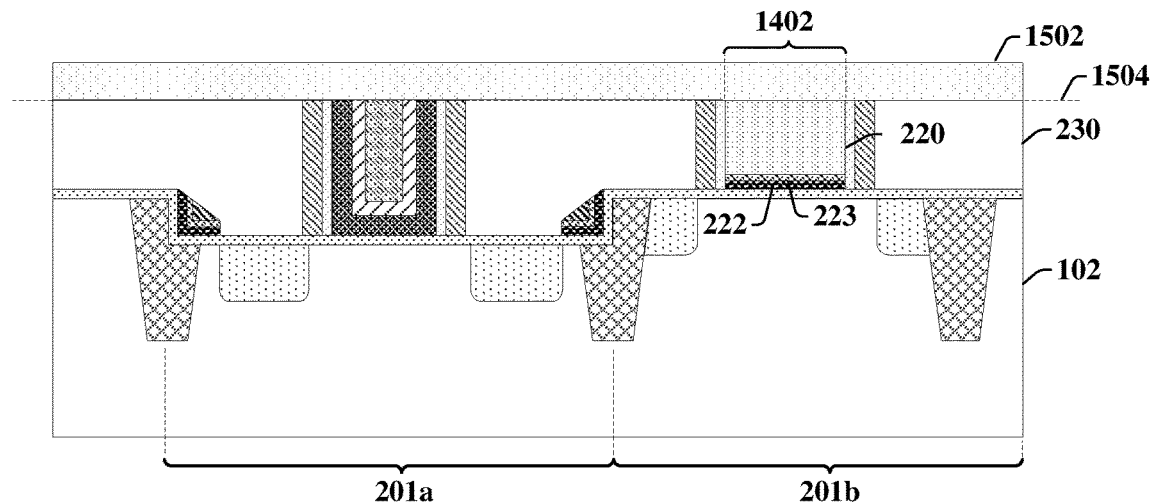

As shown in cross-sectional view 1500 of FIG. 15, a gate electrode 220 is formed within the gate electrode cavity 1402. In various embodiments, the gate electrode 220 may be formed by forming a metal layer 1502 using a deposition technique (e.g., chemical vapor deposition, physical vapor deposition, etc.) and/or a plating technique (e.g., an electroplating technique). A fourth planarization process is subsequently performed along line 1504 after deposition of the metal layer 1502 to define the gate electrode 220. In various embodiments, the metal layer 1502 may comprise an n-type metal (e.g., aluminum, tantalum, titanium, hafnium, or the like) or a p-type metal (e.g., nickel, cobalt, molybdenum, platinum, lead, gold, or the like).

Figure 16:
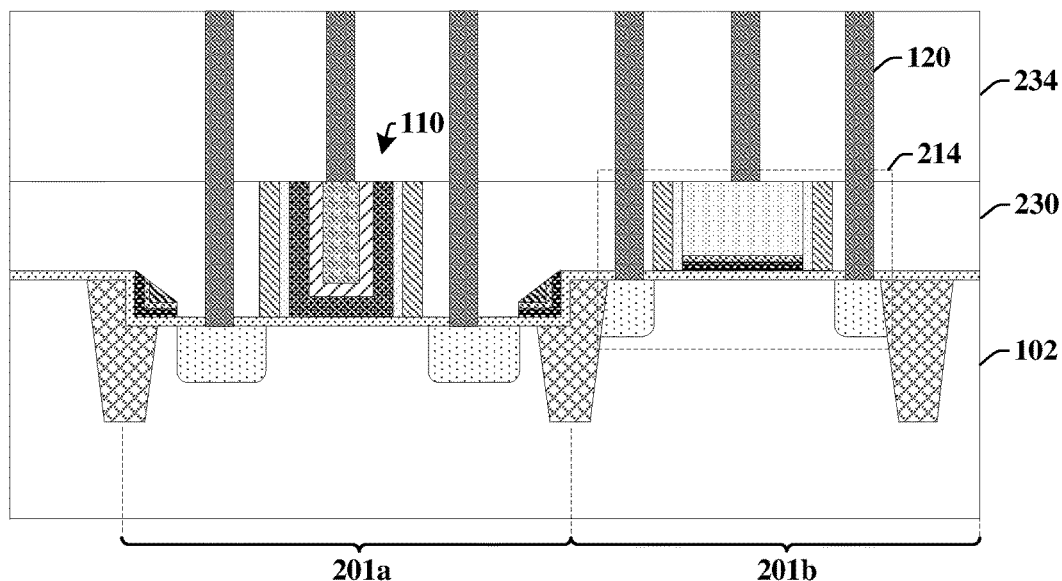

As shown in cross-sectional view 1600 of FIG. 16, conductive contacts 120 are formed within a second ILD layer 234 formed over the first ILD layer 230. The conductive contacts 120 may be formed by selectively etching the second ILD layer 234 to form openings, and by subsequently depositing a conductive material within the openings. In some embodiments, the conductive material may comprise tungsten or titanium nitride, for example.

FIGS. 17-34 illustrate cross-sectional views 1700-3400 of some alternative embodiments of a method of forming an integrated chip having an embedded FeRAM device with a nested electrode. Although FIGS. 17-34 are described in relation to a method, it will be appreciated that the structures disclosed in FIGS. 17-34 are not limited to such a method, but instead may stand alone as structures independent of the method.

Figure 17:
FIGS. 17-34 illustrate cross-sectional views of some alternative embodiments of a method of forming an integrated chip having an embedded FeRAM device with a nested electrode.

As shown in cross-sectional view 1700 of FIG. 17, a pad dielectric 1702 and a protective layer 1704 are formed over a semiconductor substrate 102. The pad dielectric 1702 and the protective layer 1704 continuously extend over an embedded memory region 201a and a logic region 201b within the semiconductor substrate 102. The pad dielectric 1702 and the protective layer 1704 may comprise, for example, silicon oxide, or the like. The pad dielectric 1702 and the protective layer 1704 may be formed by a thermal process and/or by a deposition process (e.g., CVD, PVD, ALD, or the like).

Figure 18:
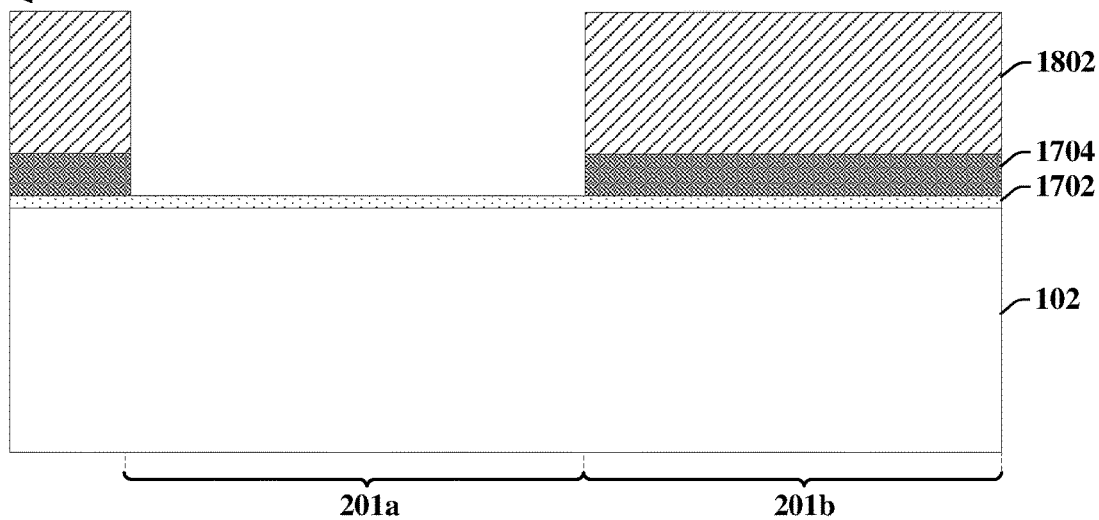

As shown in cross-sectional view 1800 of FIG. 18, the protective layer 1704 is patterned to remove the protective layer 1704 from over the embedded memory region 201a. The patterning may, for example, be performed by selectively exposing the protective layer 1704 to a first etchant according to a first masking layer 1802 over the logic region 201b. In various embodiments, the first masking layer 1802 may comprise, for example, a photoresist layer, a hard mask layer, or some other suitable mask material.

Figure 19:
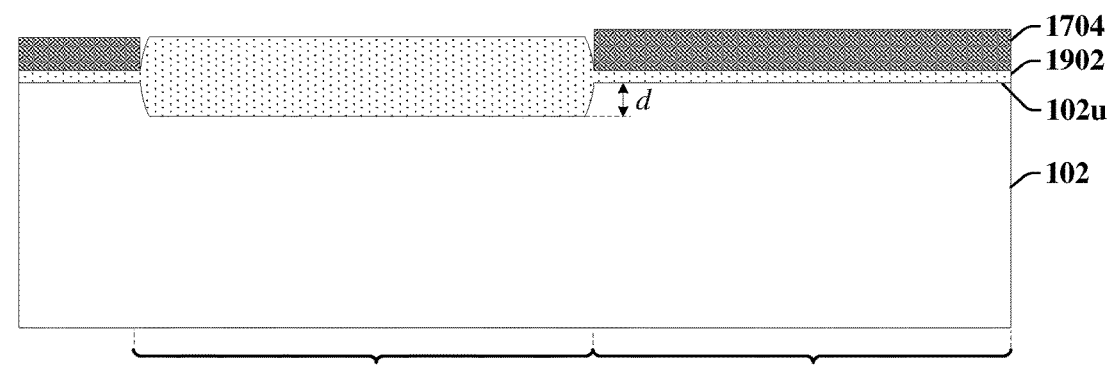

As shown in cross-sectional view 1900 of FIG. 19, a thermal oxidation process is performed to oxidize the semiconductor substrate 102 within the embedded memory region 201a. Oxidizing the semiconductor substrate 102 increases a thickness of the pad dielectric 1902 within the embedded memory region 201a by consuming the semiconductor substrate 102 within the embedded memory region 201a. Consuming the semiconductor substrate 102 within the embedded memory region 201a recesses the semiconductor substrate 102 within the embedded memory region 201a so as to recess the semiconductor substrate 102 below an upper surface 102u of the semiconductor substrate 102 by a non-zero distance d. In some embodiments, the non-zero distance d may be greater than approximately 10 nm. In various embodiments, the thermal oxidation process may comprise, for example, a wet oxidation process and/or a dry oxidation process.

Figure 20:
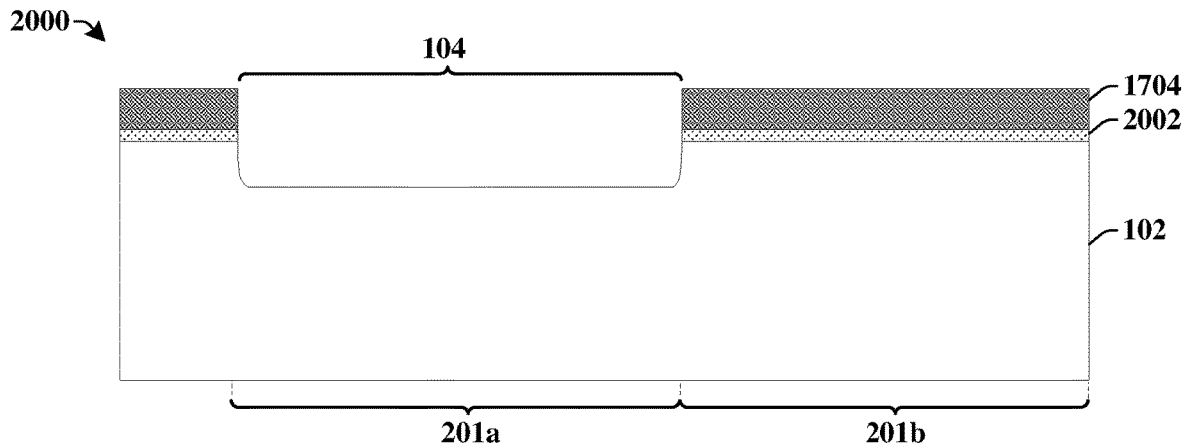

As shown in cross-sectional view 2000 of FIG. 20, the pad dielectric 2002 is removed in areas not covered by the protective layer 1704. In some embodiments, the pad dielectric 2002 may be removed by selectively exposing the pad dielectric (1902 of FIG. 19) to a second etchant according to the protective layer 1704. In various embodiments, the second etchant may comprise a wet etchant or a dry etchant.

Figure 21:
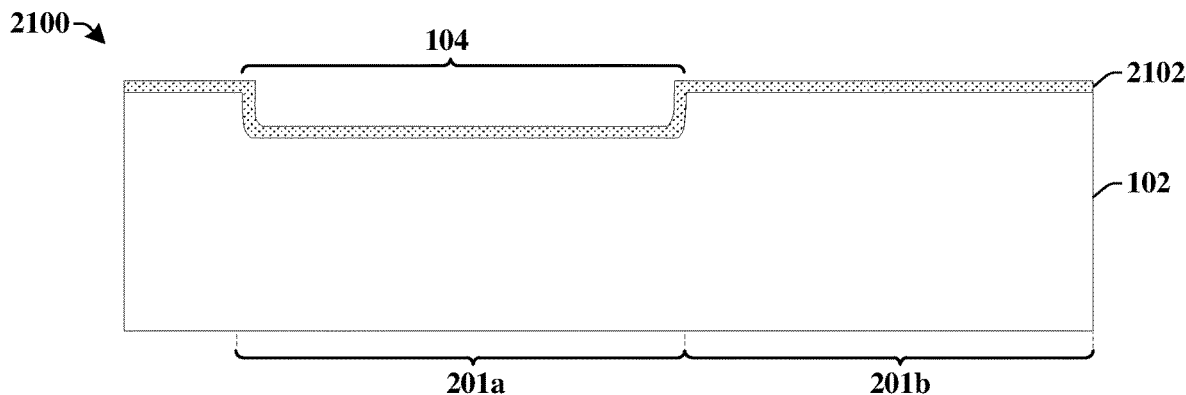

As shown in cross-sectional view 2100 of FIG. 21, the protective layer 1704 is removed and second pad dielectric 2102 is formed over the semiconductor substrate 102. In some embodiments, the protective layer 1704 may be removed by one or more etching processes and/or some other suitable removal processes. In some embodiments, the second pad dielectric 2102 is formed by a thermal process.

Figure 22:
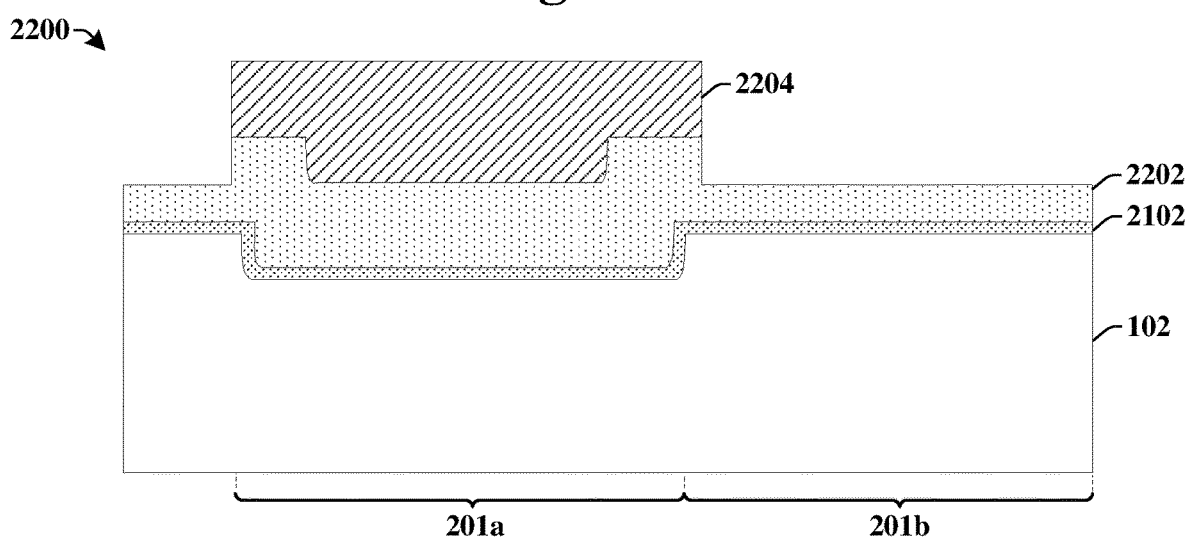

As shown in cross-sectional view 2200 of FIG. 22, a second protective layer 2202 is formed over the second pad dielectric 2102. The second protective layer 2202 is subsequently etched according to a masking layer 2204 (e.g., a photoresist) to reduce a thickness of the second protective layer 2202 in the logic region 201b. The reduction in thickness of the second protective layer 2202 within the logic region 201b causes the second protective layer 2202 have substantially equal heights within the embedded memory region 201a and the logic region 201b.

Figure 23:
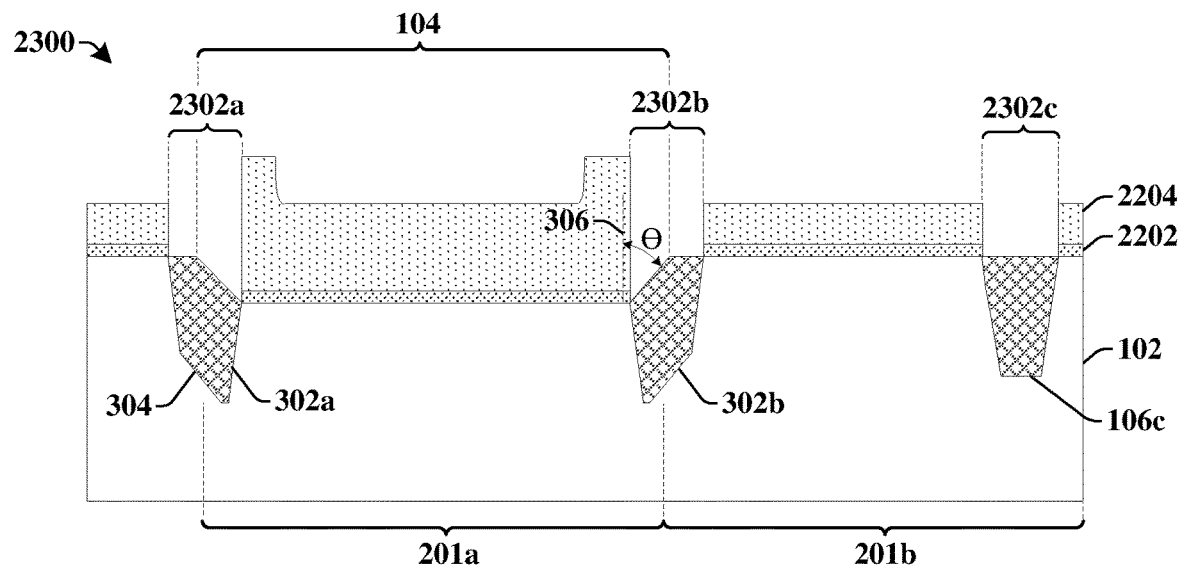

As shown in cross-sectional view 2300 of FIG. 23, the semiconductor substrate 102 is patterned to form trenches 2302a-2302c within the semiconductor substrate 102. The trenches 2302a-2302c are subsequently filled with one or more dielectric materials to form one or more isolation structures 302a-302b and 106c. The one or more isolation structures 302a, 302b, and 106c demarcate a region of the semiconductor substrate 102 for an individual memory cell under manufacture, and a region of the semiconductor substrate 102 for an individual logic device under manufacture.

In some embodiments, isolation structures 302a-302b may have angled lower sidewalls 304, since the isolation structures 302a-302b are formed over edges of the depressed region 104. In some embodiments, the isolation structures 302a-302b may further comprise angled upper sidewalls, which are oriented at an acute angle θ with respect to a line 306 that is normal to the recessed surface 101a of the substrate 101. In some embodiments, the acute angle θ may be in a range of between approximately 10° and approximately 80°. In other embodiments, the acute angle θ may be in a range of between approximately 30° and approximately 60°.

Figure 24:
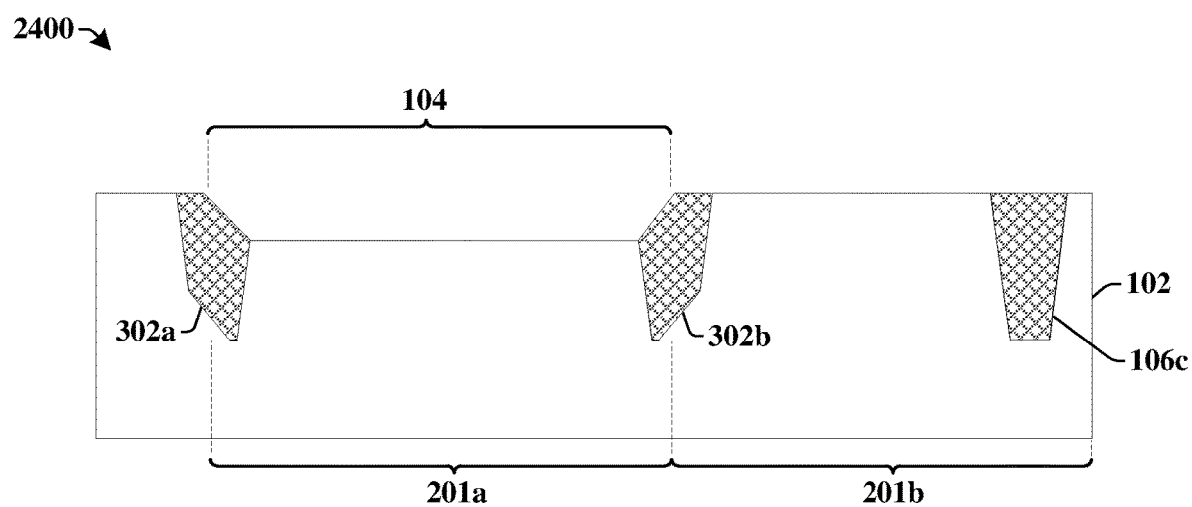

As shown in cross-sectional view 2400 of FIG. 24, the second pad dielectric 2102 and the second protective layer 2202 are removed.

Figure 25:
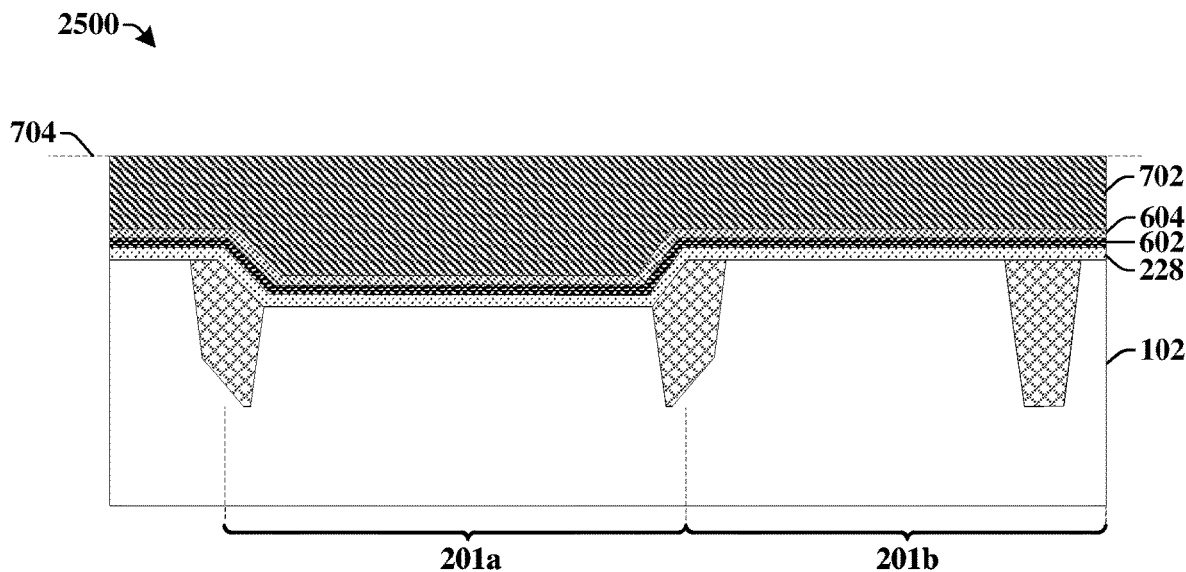

As shown in cross-sectional view 2500 of FIG. 25, a first dielectric layer 228 is formed over the substrate 101. The first dielectric layer 228 is arranged along horizontally extending surfaces and vertically extending surfaces of the substrate 101. A dielectric film 602 is formed over the first dielectric layer 228, a metal cap layer 604 is formed over the dielectric film 602, and a sacrificial layer 702 is formed over the metal cap layer 604. After deposition of the sacrificial layer 702, a first planarization process (e.g., a CMP process) is performed on the sacrificial layer 702 along line 704.

Figure 26:
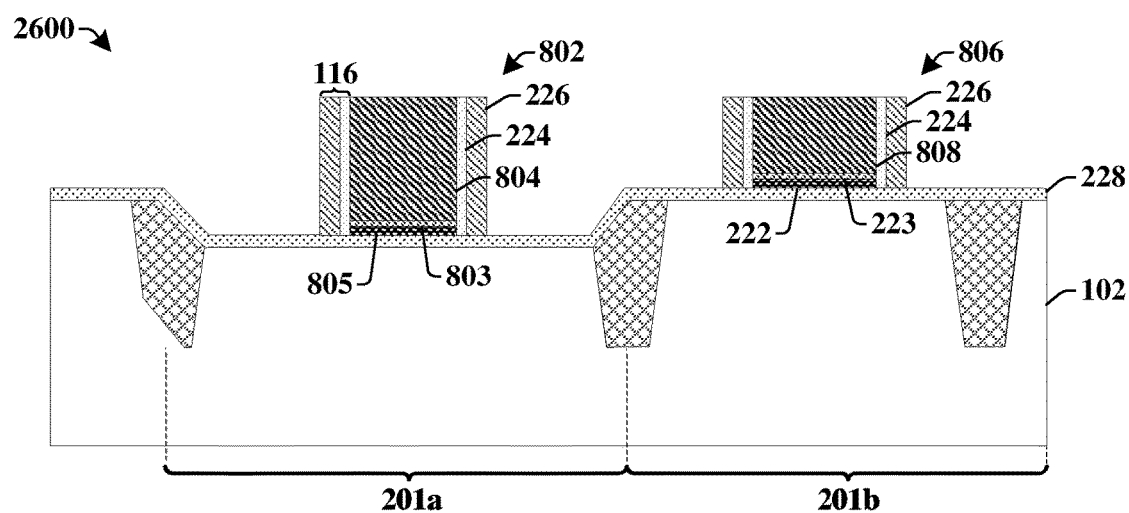

As shown in cross-sectional view 2600 of FIG. 26, the sacrificial layer (702 of FIG. 25), the dielectric film (602 of FIG. 25), and the metal cap layer (604 of FIG. 25) are patterned to define a sacrificial memory structure 802 within the embedded memory region 201a and a sacrificial gate structure 806 within the logic region 201b. The sacrificial memory structure 802 comprises a sacrificial memory element 804 over a sacrificial dielectric layer 805 and a sacrificial metal cap 803. The sacrificial gate structure 806 comprises a sacrificial gate electrode 808 over a gate dielectric 222 and a metal cap layer 223. Sidewall spacers 116 may be formed along sidewalls of the sacrificial memory structure 802 and the sacrificial gate structure 806.

Figure 27:
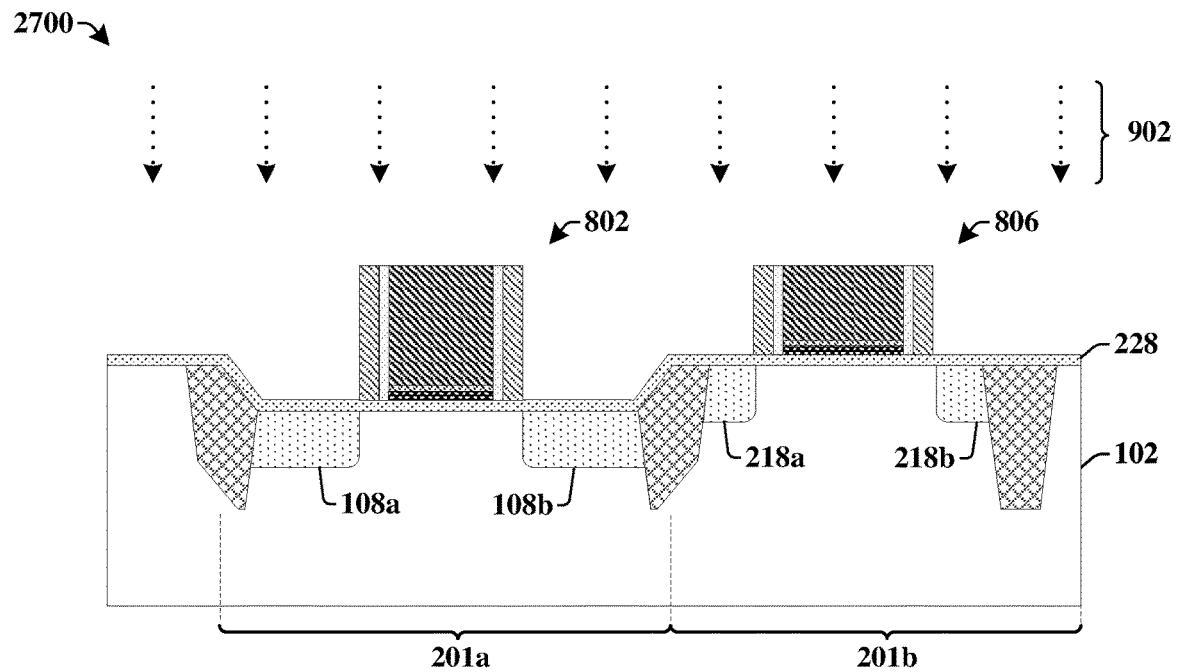

As shown in cross-sectional view 2700 of FIG. 27, a first doped region 108a and a second doped region 108b are formed within the memory region 201a of the semiconductor substrate 102. A source region 218a and a drain region 218b are also formed within the logic region 201b of the semiconductor substrate 102. In some embodiments, the first doped region 108a, the second doped region 108b, the source region 218a, and the drain region 218b may be formed by selectively implanting dopant species 902 into the semiconductor substrate 102 using two or more implantation processes.

Figure 28:
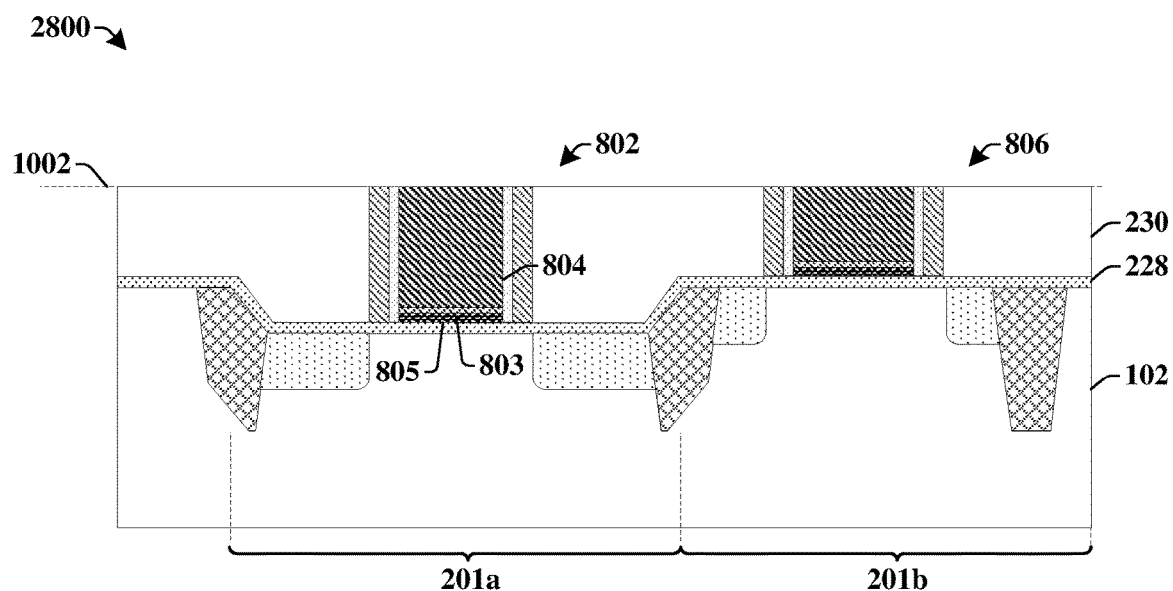

As shown in cross-sectional view 2800 of FIG. 28, a first inter-level dielectric (ILD) layer 230 is formed over the substrate 101. The first ILD layer 230 laterally surrounds the sacrificial memory structure 802 and the sacrificial gate structure 806. After formation of the first ILD layer 230, a second planarization process may be performed along line 1002 to expose upper surfaces of the sacrificial memory structure 802 and the sacrificial gate structure 806.

Figure 29:
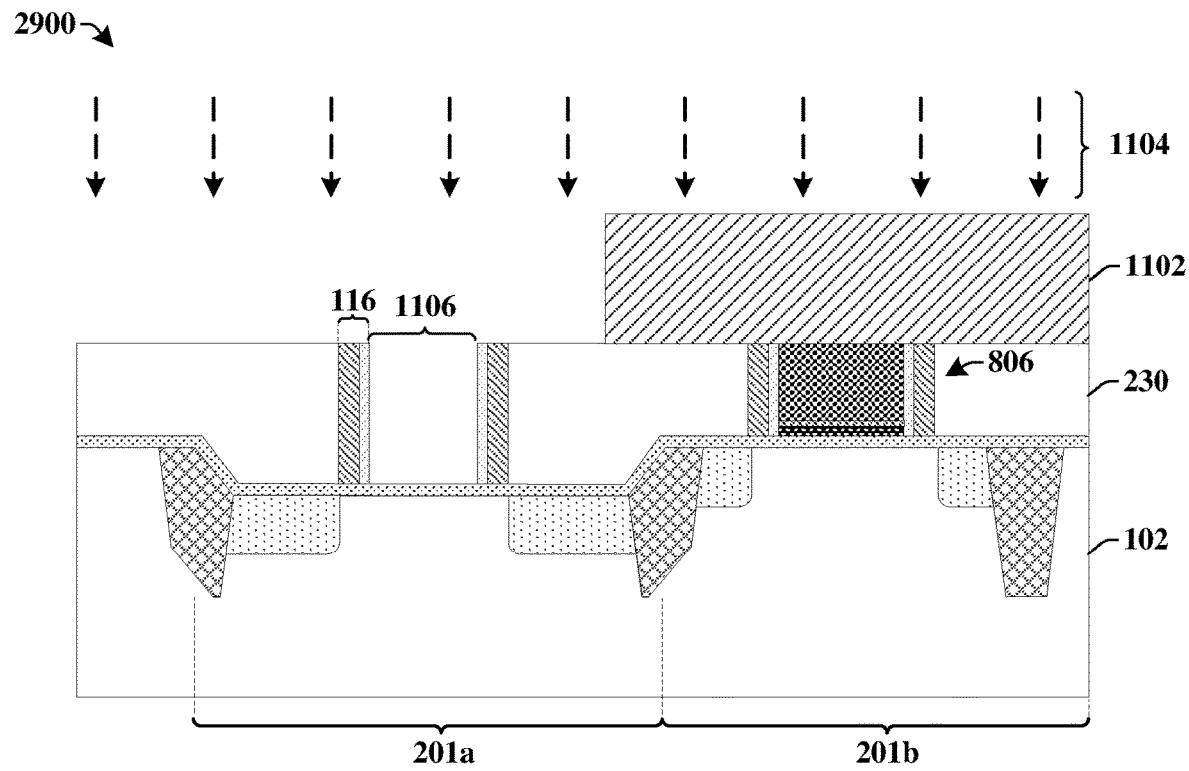

As shown in cross-sectional view 2900 of FIG. 29, the sacrificial memory element (804 of FIG. 28), the sacrificial dielectric layer (805 of FIG. 28), and the sacrificial metal cap (803 of FIG. 28) are removed from the sacrificial memory structure (802 of FIG. 28) to define a memory device cavity 1106. In some embodiments, prior to removing the sacrificial memory element (804 of FIG. 28), the sacrificial dielectric layer (805 of FIG. 28), and the sacrificial metal cap (803 of FIG. 28), a fourth masking layer 1102 may be formed over the logic region 201b to prevent the sacrificial gate electrode 808 from being removed by the fourth etchant 1104.

Figure 30:
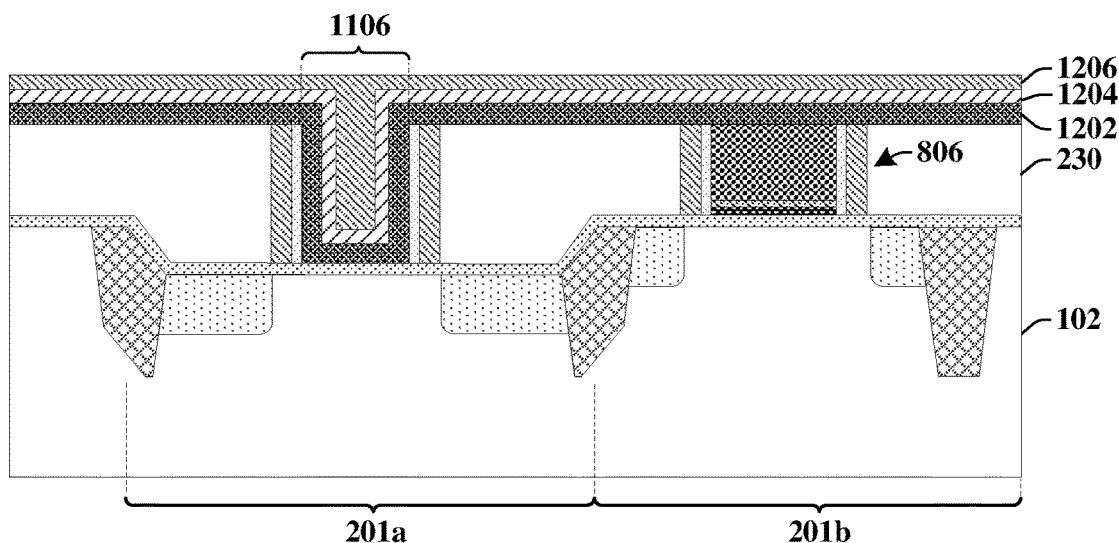

As shown in cross-sectional view 3000 of FIG. 30, a ferroelectric layer 1202 is formed over the substrate 101, a metallic layer 1204 is formed over the ferroelectric layer 1202, and a conductive layer 1206 is formed over the metallic layer 1204.

Figure 31:
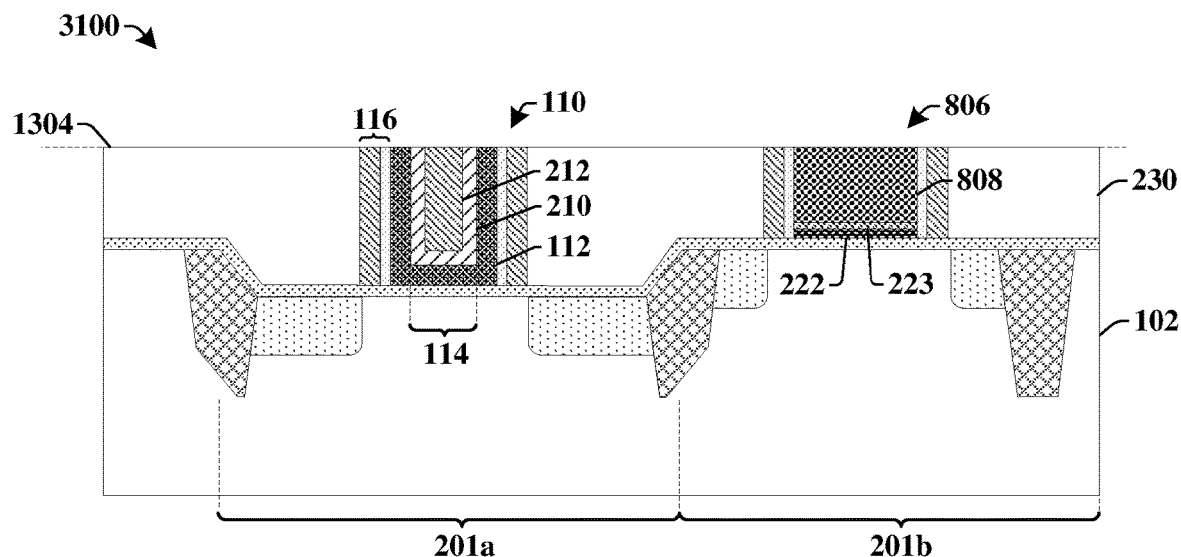

As shown in cross-sectional view 3100 of FIG. 31, a third planarization process is performed to define an FeRAM device 110. The third planarization process removes a part of the ferroelectric layer (1202 of FIG. 30) to define a ferroelectric material 112. The third planarization process also removes a part of the metallic layer (1204 of FIG. 30) and the conductive layer (1206 of FIG. 30) to define a conductive electrode 114 comprising a metallic material 210 and a conductive material 212.

Figure 32:
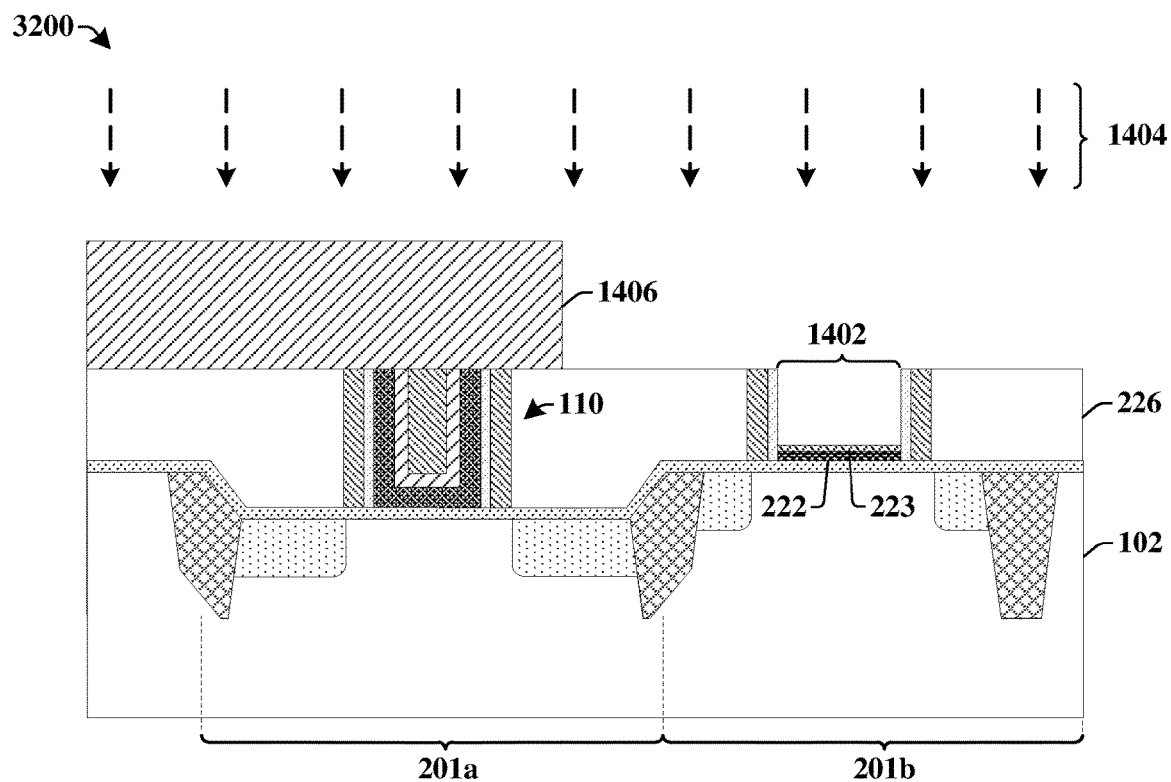

As shown in cross-sectional view 3200 of FIG. 32, the sacrificial gate electrode (808 of FIG. 31) is removed from the sacrificial gate structure (806 of FIG. 31) to define a gate electrode cavity 1402.

Figure 33:
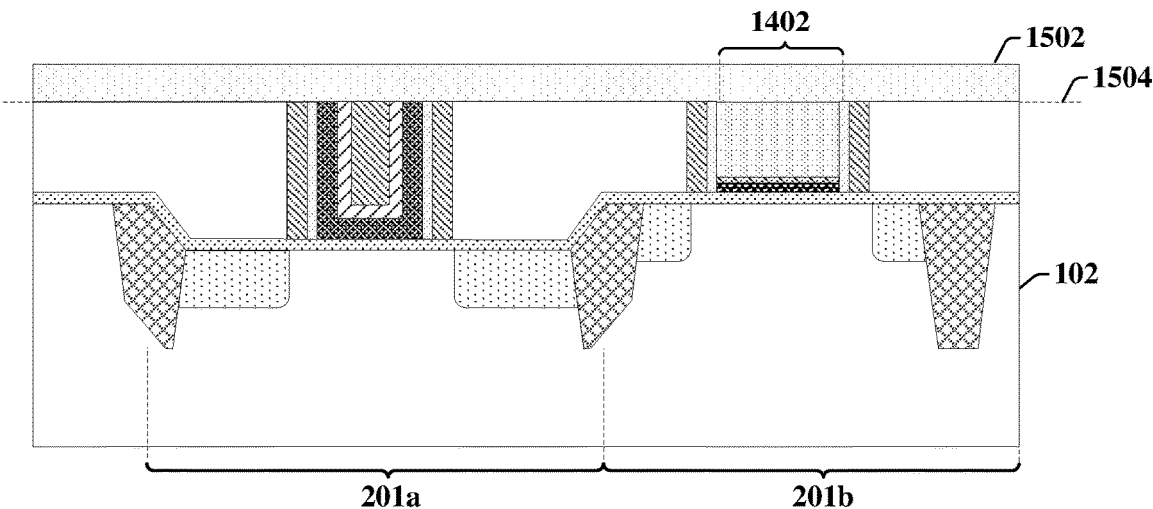

As shown in cross-sectional view 3300 of FIG. 33, a gate electrode 220 is formed within the gate electrode cavity 1402. In various embodiments, the gate electrode 220 may be formed by forming a metal layer using a deposition technique (e.g., chemical vapor deposition, physical vapor deposition, etc.) and/or a plating technique (e.g., an electroplating technique). A fourth planarization process is subsequently performed after deposition of the metal layer to define the gate electrode 220.

Figure 34:
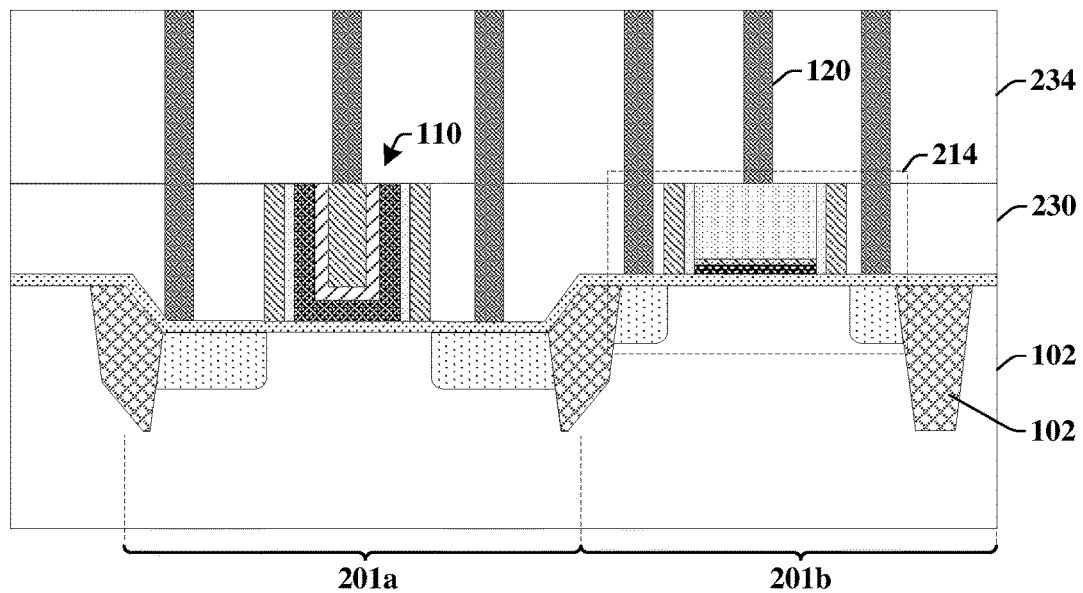

As shown in cross-sectional view 3400 of FIG. 34, conductive contacts 120 are formed within a second ILD layer 234 formed over the first ILD layer 230.

Figure 35:
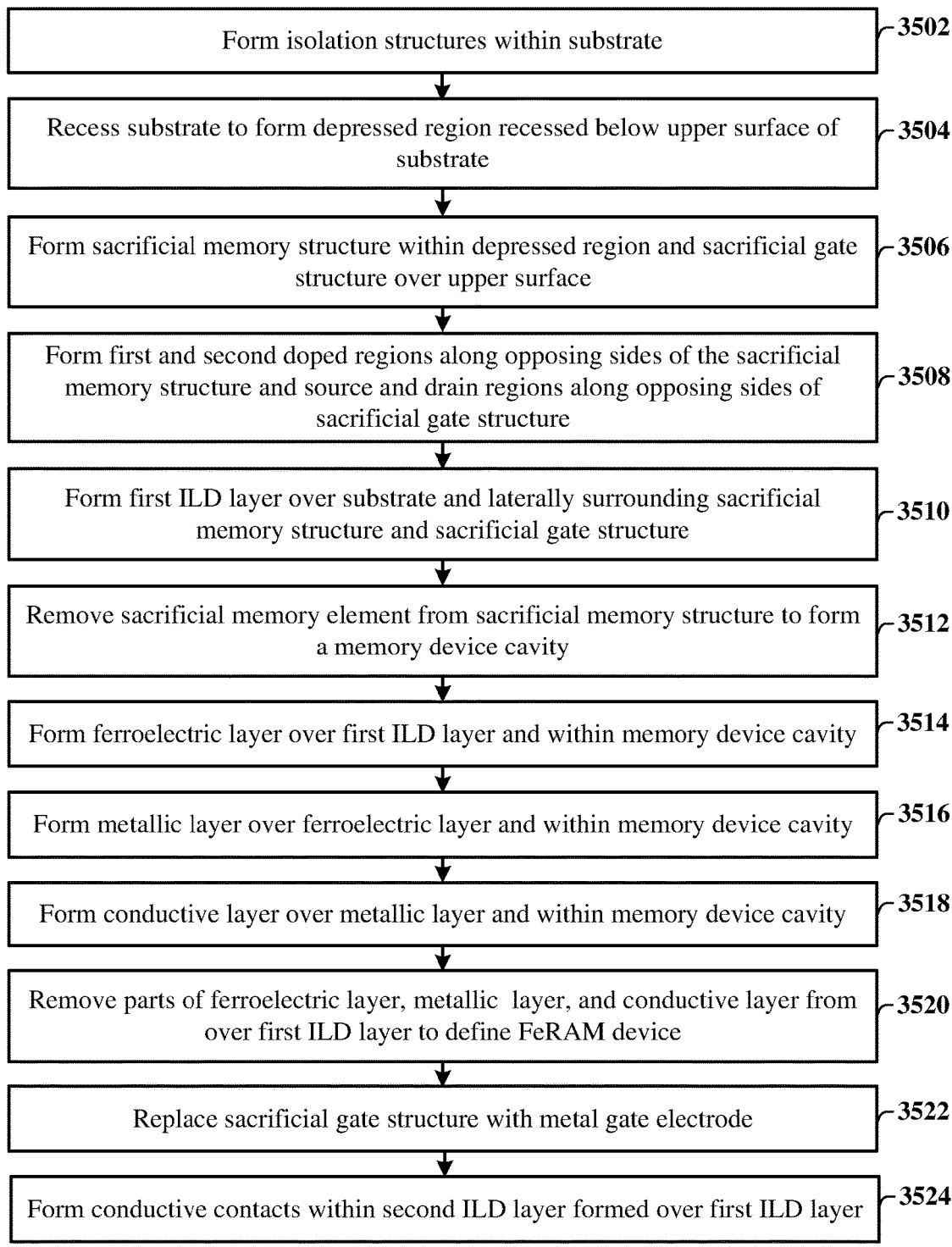
FIG. 35 illustrates a flow diagram of some embodiments of a method of forming an integrated chip having an embedded FeRAM device with a nested electrode.

FIG. 35 illustrates a flow diagram of some embodiments of a method 3500 of forming an integrated chip having an embedded FeRAM device with a nested electrode.

While method 3500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 3502, a plurality of isolation structures are formed within a substrate. FIG. 4 illustrates a cross-sectional view 400 of some embodiments corresponding to act 3502. FIGS. 22-24 illustrate cross-sectional views 2200-2400 of some alternative embodiments corresponding to act 3502.

Figure 5:
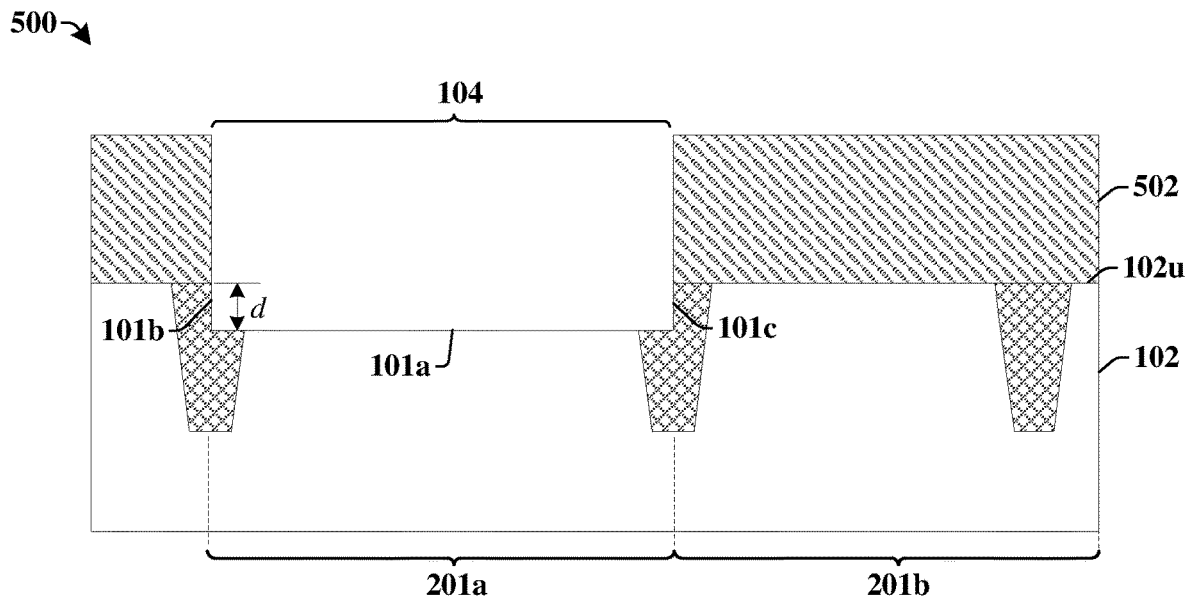

At 3504, a substrate is recessed to form a depressed region recessed below an upper surface of the substrate. FIG. 5 illustrates a cross-sectional view 500 of some embodiments corresponding to act 3504. FIGS. 17-20 illustrate cross-sectional views 1700-2000 of some alternative embodiments corresponding to act 3504.

At 3506, a sacrificial memory structure is formed within the depressed region and a sacrificial gate structure is formed over the upper surface of the substrate. FIGS. 6-8 illustrate cross-sectional views 600-800 of some embodiments corresponding to act 3506. FIGS. 25-26 illustrate cross-sectional views 2500-2600 of some alternative embodiments corresponding to act 3506.

At 3508, first and second doped regions are formed along opposing sides of the sacrificial memory structure and source and drain regions are formed along opposing sides of sacrificial gate structure. FIG. 9 illustrates a cross-sectional view 900 of some embodiments corresponding to act 3508. FIG. 27 illustrates a cross-sectional view 2700 of some alternative embodiments corresponding to act 3508.

At 3510, a first ILD layer over a substrate and laterally surrounding sacrificial memory structure and sacrificial gate structure. FIG. 10 illustrates a cross-sectional view 1000 of some embodiments corresponding to act 3510. FIG. 28 illustrates a cross-sectional view 2800 of some alternative embodiments corresponding to act 3510.

At 3512, a sacrificial memory element is removed from the sacrificial memory structure to form a memory device cavity. FIG. 11 illustrates a cross-sectional view 1100 of some embodiments corresponding to act 3512. FIG. 29 illustrates a cross-sectional view 2900 of some alternative embodiments corresponding to act 3512.

At 3514, a ferroelectric layer is formed over the first ILD layer and within the memory device cavity. FIG. 12 illustrates a cross-sectional view 1200 of some embodiments corresponding to act 3514. FIG. 30 illustrates a cross-sectional view 3000 of some alternative embodiments corresponding to act 3514.

At 3516, a metallic layer is formed over the ferroelectric layer and within the memory device cavity. FIG. 12 illustrates a cross-sectional view 1200 of some embodiments corresponding to act 3516. FIG. 30 illustrates a cross-sectional view 3000 of some alternative embodiments corresponding to act 3516.

At 3518, a conductive layer is formed over the metallic layer and within the memory device cavity. FIG. 12 illustrates a cross-sectional view 1200 of some embodiments corresponding to act 3518. FIG. 30 illustrates a cross-sectional view 3000 of some alternative embodiments corresponding to act 3518.

At 3520, parts of the ferroelectric layer, the metallic layer, and the conductive layer are removed from over the first ILD layer to define an FeRAM device. FIG. 13 illustrates a cross-sectional view 1300 of some embodiments corresponding to act 3520. FIG. 31 illustrates a cross-sectional view 3100 of some alternative embodiments corresponding to act 3520.

At 3522, the sacrificial gate structure is replaced with a metal gate electrode. FIGS. 14-15 illustrate cross-sectional views 1400-1500 of some embodiments corresponding to act 3522. FIGS. 32-33 illustrate cross-sectional views 3200-3300 of some alternative embodiments corresponding to act 3522.

At 3524, conductive contacts are formed within a second ILD layer formed over the first ILD layer. FIG. 16 illustrates a cross-sectional view 1600 of some embodiments corresponding to act 3524. FIG. 34 illustrates a cross-sectional view 3400 of some alternative embodiments corresponding to act 3524.

Accordingly, in some embodiments, the present disclosure relates to a method of forming an embedded FeRAM device, which uses a replacement process to form an FeRAM device having a nested electrode. The replacement process enables the formation of the embedded FeRAM device by way of an efficient and low-cost fabrication process.

In some embodiments, the present disclosure relates to an integrated chip. The integrated chip includes a first doped region and a second doped region within a substrate; and an FeRAM (ferroelectric random access memory) device arranged over the substrate between the first doped region and the second doped region, the FeRAM device includes a ferroelectric material arranged over the substrate, and a conductive electrode over the ferroelectric material and between sidewalls of the ferroelectric material. In some embodiments, the substrate has a recessed surface extending between a first sidewall and a second sidewall of the substrate to define a depressed region within an upper surface of the substrate; and the FeRAM device is arranged over the recessed surface and directly between the first sidewall and the second sidewall. In some embodiments, the integrated chip further includes a first isolation structure arranged within a semiconductor substrate and defining the first sidewall of the substrate; and a second isolation structure arranged within the semiconductor substrate and defining the second sidewall of the substrate. In some embodiments, the first sidewall of the substrate is oriented at an angle that causes a width of the first isolation structure to decrease as a height over the recessed surface increases. In some embodiments, the recessed surface of the substrate is defined by a first horizontally extending surface of the first isolation structure, a second horizontally extending surface of the second isolation structure, and a third horizontally extending surface of the semiconductor substrate. In some embodiments, the integrated chip further includes a replacement gate remnant extending from over the first horizontally extending surface of the first isolation structure to over the third horizontally extending surface of the semiconductor substrate, the replacement gate remnant has a metal cap layer disposed between a dielectric film and a sacrificial polysilicon layer. In some embodiments, the integrated chip further includes sidewall spacers having one or more dielectric materials arranged on opposing sides of the FeRAM device; and an etch stop layer laterally separated from the FeRAM device by the sidewall spacers, the etch stop layer does not cover the FeRAM device. In some embodiments, the integrated chip further includes a transistor device having a gate electrode disposed over the substrate; and an inter-level dielectric (ILD) layer laterally surrounding the FeRAM device and the transistor device, the gate electrode and the FeRAM device extending to an upper surface of the ILD layer. In some embodiments, the ferroelectric material and the conductive electrode extend to the upper surface of the ILD layer. In some embodiments, the conductive electrode includes a metal disposed over the ferroelectric material; and a conductive material vertically and laterally separated from the ferroelectric material by the metal.

In other embodiments, the present disclosure relates to an integrated chip. The integrated chip includes a substrate having a recessed surface extending between a first sidewall and a second sidewall to define a depressed region that is recessed below an upper surface of the substrate; a first doped region and a second doped region disposed within the recessed surface of the substrate; a ferroelectric material arranged between the first doped region and the second doped region, the ferroelectric material has sidewalls defining a first recess within an upper surface of the ferroelectric material; a metallic material nested within the first recess, the metallic material has sidewalls defining a second recess within an upper surface of the metallic material; and a conductive material nested within the second recess. In some embodiments, sidewalls of the metallic material directly contact the ferroelectric material and the conductive material. In some embodiments, the ferroelectric material has a first height that is larger than a second height of the metallic material, and the conductive material has a third height that is smaller than the second height. In some embodiments, the integrated chip further includes sidewall spacers having one or more dielectric materials arranged on opposing sides of the ferroelectric material, the sidewall spacers have a height that is substantially equal to a height of the ferroelectric material. In some embodiments, the integrated chip further includes a transistor device having a gate electrode disposed over the substrate; and an inter-level dielectric (ILD) layer laterally surrounding the ferroelectric material and the transistor device, the gate electrode and the ferroelectric material extend to an upper surface of the ILD layer. In some embodiments, the ferroelectric material has a horizontally extending segment extending between a first vertical protrusion and a second vertical protrusion that protrudes outward from an upper surface of the horizontally extending segment; and the horizontally extending segment has height that is larger than a width of the first vertical protrusion.

In yet other embodiments, the present disclosure relates to a method of forming an integrated chip. The method includes forming a sacrificial memory structure over a substrate; forming an inter-level dielectric (ILD) layer over the substrate and laterally surrounding the sacrificial memory structure; removing the sacrificial memory structure to form a memory device cavity surrounded by the ILD layer; forming a ferroelectric layer over the ILD layer and within the memory device cavity; forming a metallic layer over the ferroelectric layer and within the memory device cavity; forming a conductive layer over the metallic layer and within the memory device cavity; and removing parts of the ferroelectric layer, the metallic layer, and the conductive layer from over the ILD layer to define a FeRAM device having a metallic disposed between a ferroelectric material and a conductive material. In some embodiments, the method further includes recessing a memory region of the substrate to form a depressed region recessed below an upper surface of the substrate; and forming the sacrificial memory structure within the depressed region. In some embodiments, the method further includes implanting the substrate after forming the sacrificial memory structure to form a first doped region along a first side of the sacrificial memory structure and a second doped region along a second side of the sacrificial memory structure. In some embodiments, sidewalls of the metallic layer directly contact the conductive layer and the ferroelectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip structure, comprising:
   a first doped region and a second doped region disposed within a recessed upper surface of a substrate;
   a ferroelectric material arranged over the recessed upper surface of the substrate and between the first doped region and the second doped region; and
   an isolation structure arranged within the substrate along a first side of the ferroelectric material, wherein a part of the isolation structure that is vertically below the recessed upper surface of the substrate is asymmetric about a line bisecting a bottommost surface of the isolation structure.

2. The integrated chip structure of claim 1,
   wherein the ferroelectric material has a recessed upper surface arranged laterally between interior sidewalls of the ferroelectric material facing one another; and
   wherein a conductive material is arranged on the ferroelectric material and between the interior sidewalls.

3. The integrated chip structure of claim 2, further comprising:
   a contact etch stop layer continuously contacting the isolation structure between opposing outermost edges of the isolation structure in a cross-sectional view.

4. The integrated chip structure of claim 1, further comprising:
   an inter-level dielectric (ILD) layer arranged on opposing sides of the ferroelectric material, wherein the ferroelectric material vertically extends from a top of the ILD layer to a bottom of the ILD layer.

5. The integrated chip structure of claim 4, further comprising:
   a gate insulating material vertically separating the ferroelectric material from the substrate, wherein the gate insulating material has a topmost surface below a topmost surface of the ILD layer.

6. The integrated chip structure of claim 1,
   wherein the isolation structure has a first side facing the ferroelectric material and an opposing second side facing away from the ferroelectric material, the second side of the isolation structure having a first sidewall segment having a first slope and a second sidewall segment having a second slope that is different than the first slope; and wherein the first sidewall segment and the second sidewall segment are above the bottommost surface of the isolation structure.

7. The integrated chip structure of claim 6, wherein the first side of the isolation structure has a third sidewall segment that is entirely above the recessed upper surface, a top surface of the isolation structure being separated from the third sidewall segment by an obtuse angle measured through the isolation structure.

8. An integrated chip structure, comprising:
a first doped region and a second doped region disposed within a recessed surface of a substrate;
a ferroelectric material arranged over the recessed surface of the substrate and between the first doped region and the second doped region;
an isolation structure arranged within the substrate along a first side of the ferroelectric material;
a dummy material arranged directly over and along a sidewall of the isolation structure and extending towards the ferroelectric material, the dummy material having an outermost edge that is laterally outside of the isolation structure; and
an interlevel dielectric layer arranged over the dummy material and along a side of the ferroelectric material.

9. The integrated chip structure of claim 8, further comprising:
a metallic material arranged between interior sidewalls of the ferroelectric material and along a recessed upper surface of the ferroelectric material that is laterally between the interior sidewalls; and
a conductive material arranged between interior sidewalls of the metallic material.

10. The integrated chip structure of claim 8, further comprising: a contact etch stop layer laterally separating a sidewall of the dummy material from the ferroelectric material.

11. The integrated chip structure of claim 8, wherein the dummy material comprises a dielectric.

12. The integrated chip structure of claim 8, wherein the dummy material comprises polysilicon.

13. The integrated chip structure of claim 8, further comprising: a transistor device disposed over the substrate; and an additional isolation structure arranged along a side of the transistor device facing away from the isolation structure.

14. A method of forming an integrated chip structure, comprising:
recessing a region of a substrate to form a recessed surface that is below an upper surface of the substrate and that is between sidewalls of the substrate;
forming a dielectric layer over the recessed surface;
forming a sacrificial stack over the recessed surface and the dielectric layer, wherein the sacrificial stack comprises one or more additional dielectric layers and a sacrificial material over a top surface of the one or more dielectric layers;
patterning the sacrificial stack to form a sacrificial memory structure over the substrate;
forming sidewall spacers along opposing sides of the sacrificial memory structure and over the dielectric layer;
forming a dielectric over the dielectric layer and laterally surrounding the sacrificial memory structure;
etching the sacrificial memory structure to form a memory device cavity surrounded by the dielectric; and
forming a ferroelectric material within the memory device cavity.

15. The method of claim 14, further comprising:
implanting dopants into the recessed surface of the substrate to form a source/drain region within the recessed surface, wherein a remnant of the sacrificial stack remains on the recessed surface after patterning the sacrificial stack, the remnant blocking the dopants from being implanted into part of the recessed surface.

16. The method of claim 14, further comprising:
patterning the sacrificial stack to form a sacrificial gate structure over the upper surface of the substrate.

17. The method of claim 16, wherein the sacrificial memory structure and the sacrificial gate structure are formed by exposing the sacrificial stack to an etchant according to a masking layer.

18. The method of claim 16, further comprising:
forming the dielectric over the substrate after patterning the sacrificial stack to form both the sacrificial memory structure and the sacrificial gate structure.

19. The method of claim 17, further comprising:
etching the sacrificial gate structure to form a gate electrode cavity surrounded by the dielectric; and
forming a gate electrode within the gate electrode cavity after forming the ferroelectric material within the memory device cavity.

20. The method of claim 14, further comprising:
forming a metallic material on interior sidewalls of the ferroelectric material; and
forming a conductive material on interior sidewalls of the metallic material.

* * * * *